(12) United States Patent
Talwar et al.

(10) Patent No.: US 10,560,125 B2
(45) Date of Patent: Feb. 11, 2020

(54) TECHNIQUES FOR DATA COMPRESSION

(71) Applicant: Intel Corporation, Santa Clara, CA (US)

(72) Inventors: Shilpa Talwar, Cupertine, CA (US); Christian Drewes, Germering (DE); Andreas Augustin, Munich (DE); Peter Noest, Munich (DE); Stefan Mueller-Weinfurtner, Nuremberg (DE); Oner Orhan, San Jose, CA (US); Hosein Nikopour, San Jose, CA (US); Junyoung Nam, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/037,241

(22) Filed: Jul. 17, 2018

(65) Prior Publication Data

US 2019/0238163 A1 Aug. 1, 2019

Related U.S. Application Data

(60) Provisional application No. 62/622,463, filed on Jan. 26, 2018.

(51) Int. Cl.
*H04B 1/00* (2006.01)
*H04L 27/26* (2006.01)
*H04L 25/03* (2006.01)
*H03M 7/30* (2006.01)
*H04W 28/06* (2009.01)

(52) U.S. Cl.
CPC ........ *H04B 1/0014* (2013.01); *H03M 7/3059* (2013.01); *H04L 25/03993* (2013.01); *H04L 27/265* (2013.01); *H04W 28/065* (2013.01)

(58) Field of Classification Search
CPC ............ H04B 1/0014; H04L 25/03993; H04L 27/265; H03M 7/3059; H04W 28/065
See application file for complete search history.

(56) References Cited

U.S. PATENT DOCUMENTS

| | | | | |
|---|---|---|---|---|
| 5,684,770 A | * | 11/1997 | Kim | G11B 19/04 360/13 |
| 9,838,104 B1 | * | 12/2017 | Zhang | H04B 7/0626 |
| 10,070,432 B1 | * | 9/2018 | Luo | H04W 88/085 |
| 2012/0250740 A1 | * | 10/2012 | Ling | H04W 88/085 375/219 |
| 2017/0289842 A1 | * | 10/2017 | Shor | H04W 28/0289 |
| 2018/0138979 A1 | * | 5/2018 | Shibata | H03M 7/30 |
| 2019/0066702 A1 | * | 2/2019 | Biswas | G10L 19/02 |

* cited by examiner

*Primary Examiner* — Jean B Corrielus
(74) *Attorney, Agent, or Firm* — Schiff Hardin LLP

(57) ABSTRACT

This disclosure relates to a data processing device, comprising: a digital front end (DFE) configured to convert an antenna signal to digital data, wherein the digital data comprises a plurality of data symbols; a baseband (BB) circuitry configured to process the digital data in baseband; and a digital interface between the DFE and the BB circuitry, wherein the DFE comprises a data compression circuitry configured to compress the plurality of data symbols for use in transmission via the digital interface to the BB circuitry.

15 Claims, 27 Drawing Sheets

Fig. 19a
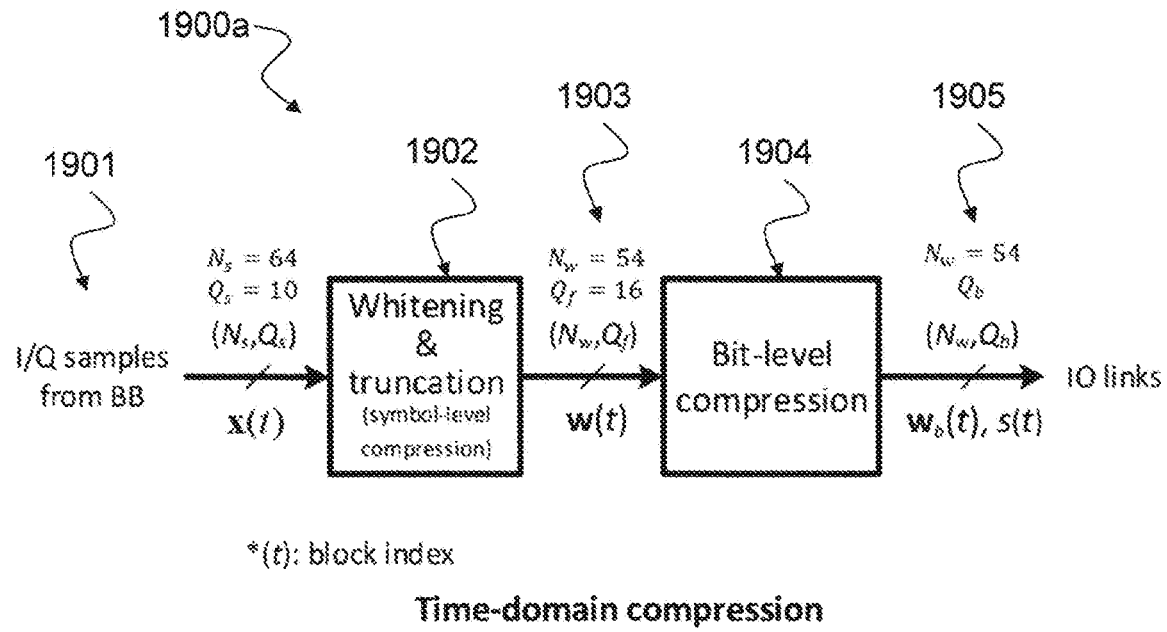
Time-domain compression
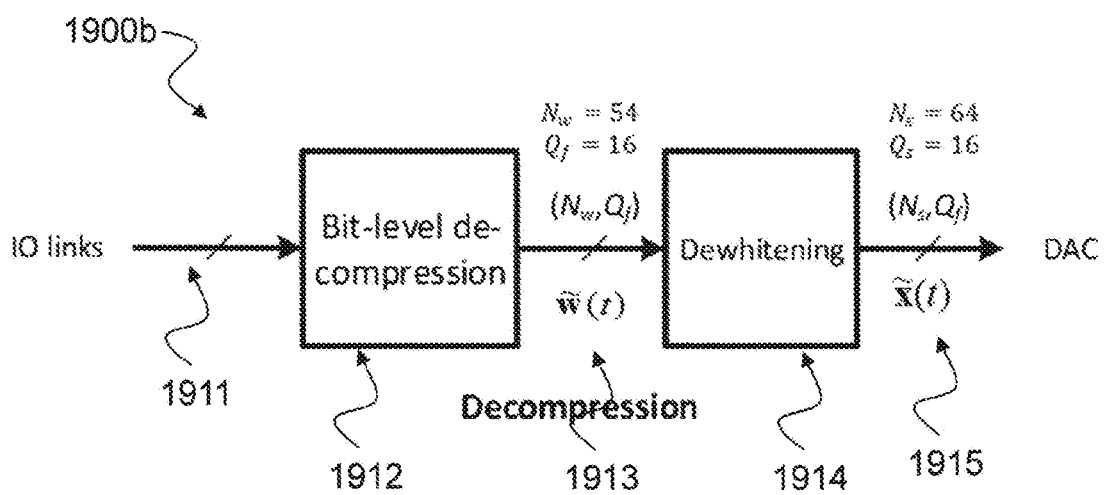
Fig. 19b ated also to methods of time domain IQ compression
TECHNIQUES FOR DATA COMPRESSION

FIELD

The disclosure relates to techniques for data compression, in particular for millimeter-wave (mmW) data rate transfer from a mmW digital front end (DFE) to a digital baseband modem. In addition, the disclosure particularly relates to a 5G RF-PHY (radio frequency physical layer) interface data compressor and to methods of time domain IQ compression and their application to mmWave IO interfaces.

BACKGROUND

The next generation communication systems 100 as exemplarily shown in FIG. 1 may use new frequency bands (millimeter wave bands) to support high data rate applications. However, the wide-bandwidth and high throughput mmWave RF front-end 111 may require high-bandwidth and rate interfaces 113 to deliver data to baseband peripherals 112 such as processor and memory. The power consumption at the I/O interface 113 may increase with the new requirements and may easily become about 1 Watt. The present disclosure relates to the question on how high data rates according to the new requirements can be supported at the I/O interface 113 while still satisfying low latency, low complexity and low power consumption.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description.

FIG. 19a is an exemplary block diagram of a hybrid compression method 1900a for time-domain compression according to the disclosure.

FIG. 19b is an exemplary block diagram of a hybrid de-compression method 1900b according to the disclosure.

DETAILED DESCRIPTION

Figure 1:
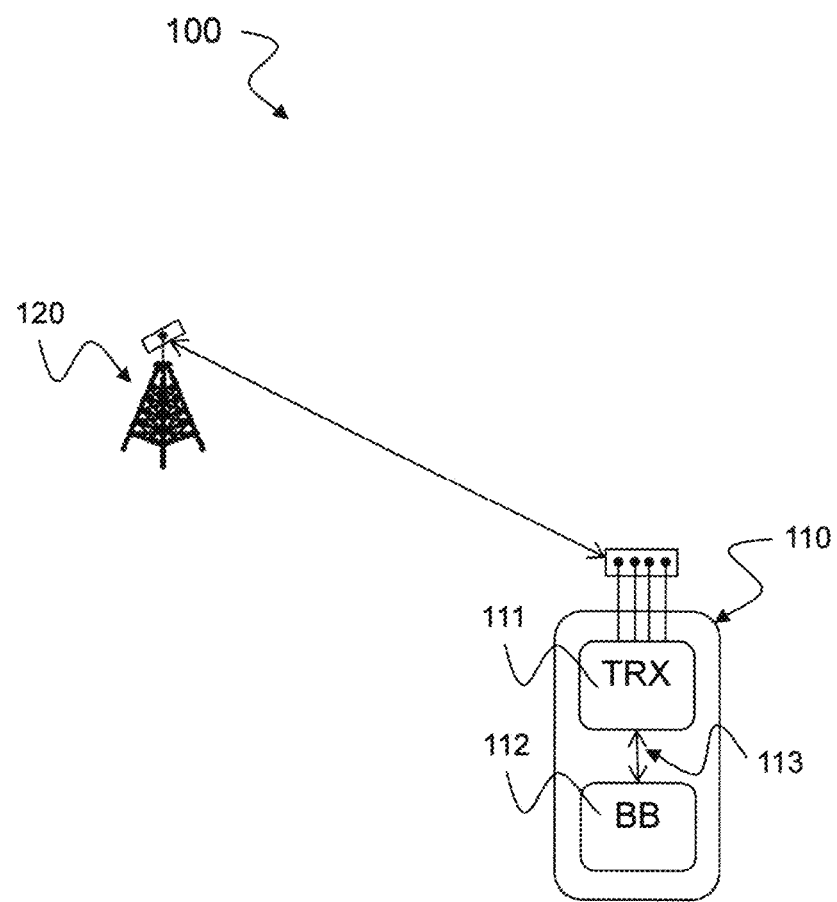
FIG. 1 is a schematic diagram illustrating an exemplary next generation communication system 100 with radio access network (RAN) node 120, e.g. gNB or base station and user equipment (UE) 110.

In the following detailed description, reference is made to the accompanying drawings, which form a part thereof, and in which is shown by way of illustration specific aspects in which the disclosure may be practiced. It is understood that other aspects may be utilized and structural or logical changes may be made without departing from the scope of the present disclosure. The following detailed description, therefore, is not to be taken in a limiting sense, and the scope of the present disclosure is defined by the appended claims.

Embodiments are described with reference to the drawings, wherein like reference numerals are generally utilized to refer to like elements throughout. In the following description, for purposes of explanation, numerous specific details are set forth in order to provide a thorough understanding of one or more aspects of embodiments. However, it may be evident to a person skilled in the art that one or more aspects of the embodiments may be practiced with a lesser degree of these specific details.

The various aspects summarized may be embodied in various forms. The following description shows by way of illustration various combinations and configurations in which the aspects may be practiced. It is understood that the described aspects and/or embodiments are merely examples, and that other aspects and/or embodiments may be utilized and structural and functional modifications may be made without departing from the scope of the present disclosure.

It is understood that comments made in connection with a described method may also hold true for a corresponding device configured to perform the method and vice versa. For example, if a specific method step is described, a corresponding device may include a unit to perform the described method step, even if such a unit is not explicitly described or illustrated in the figures. Further, it is understood that the features of the various exemplary aspects described herein may be combined with each other, unless specifically noted otherwise.

The following terms, abbreviations and notations may be used herein:
LTE: Long Term Evolution
SDQNR: signal to digital quantization noise ratio
mmW: millimeter-wave
RF: radio frequency
BB: baseband
OFDM: orthogonal frequency division multiplex
PHY: physical layer
DFE: digital front end
IO: input/output
IQ: in-phase/quadrature
FFT: Fast Fourier Transform
EVM: error vector magnitude
AP: antenna port The techniques described herein may be implemented in wireless communication networks, in particular communication networks based on mobile communication standards such as 5G new radio (NR), in particular for millimeter-wave data rate transfer from mmW digital front end (DFE) to digital baseband modem, e.g. using a 5G RF-PHY interfaces and mmWave IO interfaces. The techniques may also be applied in LTE networks, in particular LTE-A and/or OFDM and successor standards. The methods are also applicable for high speed communication standards from the 802.11 family according to the WiFi alliance, e.g. 802.11ad and successor standards. The methods and devices described below may be implemented in electronic devices such as cellular handsets and mobile or wireless devices communicating with access points and/or base stations. The described devices may include integrated circuits and/or passives and may be manufactured according to various technologies. For example, the circuits may be designed as logic integrated circuits, ASICs, analog integrated circuits, mixed signal integrated circuits, optical circuits, memory circuits and/or integrated passives.

The data compression techniques described in the following may apply Huffman codes and dictionary techniques. In Huffman codes, symbols that occur more frequently have smaller bit-widths, and symbols that occur less frequently have longer bit-widths. Dictionary techniques (such as Lempel-Ziv) build a list of frequently occurring patterns and encode them as an index in the list.

FIG. 1 is a schematic diagram illustrating a next generation communication system 100 with radio access network (RAN) node 120, e.g. gNB or base station and user equipment (UE) 110.

The next generation communication systems 100 may use new frequency bands (millimeter wave bands) to support high data rate applications. However, the wide-bandwidth and high throughput mmWave RF front-end 111 may require high-bandwidth and rate interfaces 113 to deliver data to baseband peripherals 112 such as processor and memory.

For example, considering data interface (I/O link) 113 from analog-to-digital converter (ADC) output (on TRX 111 shown in FIG. 1) to baseband processor 112, the total power dissipation of mmWave receiver may depend on power efficiency of microprocessor I/O interface, i.e. digital interface 113.

For a microprocessor I/O interface with a figure of merit 10 mW/Gb/s for a receiver with 4 receive RF-chains and 12 bit ADCs at Nyquist sampling rate of 1 GHz bandwidth channel, the power consumption at the I/O interface may easily become about 1 Watt.

In this disclosure a 5G data compressor signal processing concept is introduced that may be applied in millimeter-wave (mmW) data rate transfer from mmW TRX to modem digital baseband. Using this concept may support reduction of 5G raw data rate and number of high speed digital interface lanes for effective data rates beyond 2 Gbps (see FIGS. 2 to 12 described below).

In one exemplary implementation of TRX 111, baseband 112 and interface 113, a Serial MPhy based SMARTi™ connects digital interface with control and data channels using e.g. Gear3+ speed grade with 7.5 Gbps per lane and minimum 8 to 10 RX lanes for about 50 Gbps raw data rate at the interface 113 leading to about 5 to 6 Gbs effective data rate to AP. An alternative approach is a higher speed digital interface 113.

Table 1 illustrates possible interface configuration versus capability needs.

TABLE 1

Interface configuration versus capability needs

| Aggregated BW | MIMO Layers | Interface Rate | MPHY G3 + B # Lanes (Headroom) | MPHY G4B # Lanes (Headroom) |
|---|---|---|---|---|
| 160 MHz | 4 | ~20 Gbps | 4 (10%) | 3 (23%) |
| 320 MHz | 2 | ~20 Gbps | 4 (10%) | 3 (23%) |
| 320 MHz | 4 | ~40 Gbps | 8 (10%) | 5 (10%) |
| 480 MHz | 4 | ~60 Gbps | 12 (11%) | 8 (14%) |
| 800 MHz | 2 | ~50 Gbps | 10 (11%) | 6 (5%) |
| 960 MHz | 2 | ~60 Gbps | 12 (11%) | 8 (14%) |
| 960 MHz | 4 | ~120 Gbps | 23 (7%) | 15 (10%) |

With increasing data rates going from 4G to 5GNR the TRX to BB interface 113 may get more and more complex in terms of required number of interface lanes for a given serial interface standard. This may prevent the simple routing of the digital interface on PCB (printed circuit board) and the replacement of RF cables by integration of the whole TRX together with the mmW FE heads using a digital interface for data rates beyond 2 Gbps. Disruptive serial interface innovation may be required otherwise in the range above 15 Gbps per link with new modulation schemes to keep the number of lanes and power dissipation under control.

The new 5G data compressor signal processing concept may avoid running in these complexity issues. Instead, the load on the digital interface 113 may be significantly reduced, because only the compressed data has to be transported.

Besides a hardware realization for the new 5G data compressor signal processing concept (described with respect to FIGS. 2 to 12), a lossless and very low loss compression algorithm for IQ data is presented (described with respect to FIGS. 13 to 27). Algorithms are provided to realize lossless and very low loss compression for IQ data with very low latency that can be efficiently implemented in RTL (resistor transistor logic). Bitwise lossless and low complexity lossy compression methods as well as temporal (symbol-wise) compression methods are provided in the following (see FIGS. 13 to 27) that may be applied to 5G mmWave I/O interfaces.

The disclosed bitwise methods may work on small blocks of data to provide low latency. Due to high bandwidth channel and limited clock rate, the disclosed algorithms target for real-time processing with low complexity operations. In order to reduce processing delay, the algorithms may perform block processing rather than joint processing of a large sequence of data. The presented bit-wise lossless compression method may have only 1% compression gap from the theoretical optimal compression methods as shown below with respect to FIGS. 13 to 27. This method may take advantage of non-uniform distribution of signal. The presented bitwise lossy compression method may outperform existing CPRI compression methods in terms of EVM. This method may also take into account non-uniform distribution of signal.

The presented temporal compression method may take into account temporal correlation among data symbols, for example due to underutilization of the communication channel to reduce rate of time-domain symbols with low EVM. The disclosed method may consider a symbol-wise compression through whitening and truncation of colored Gaussian signals as shown below with respect to FIGS. 13 to 27.

Figure 2:
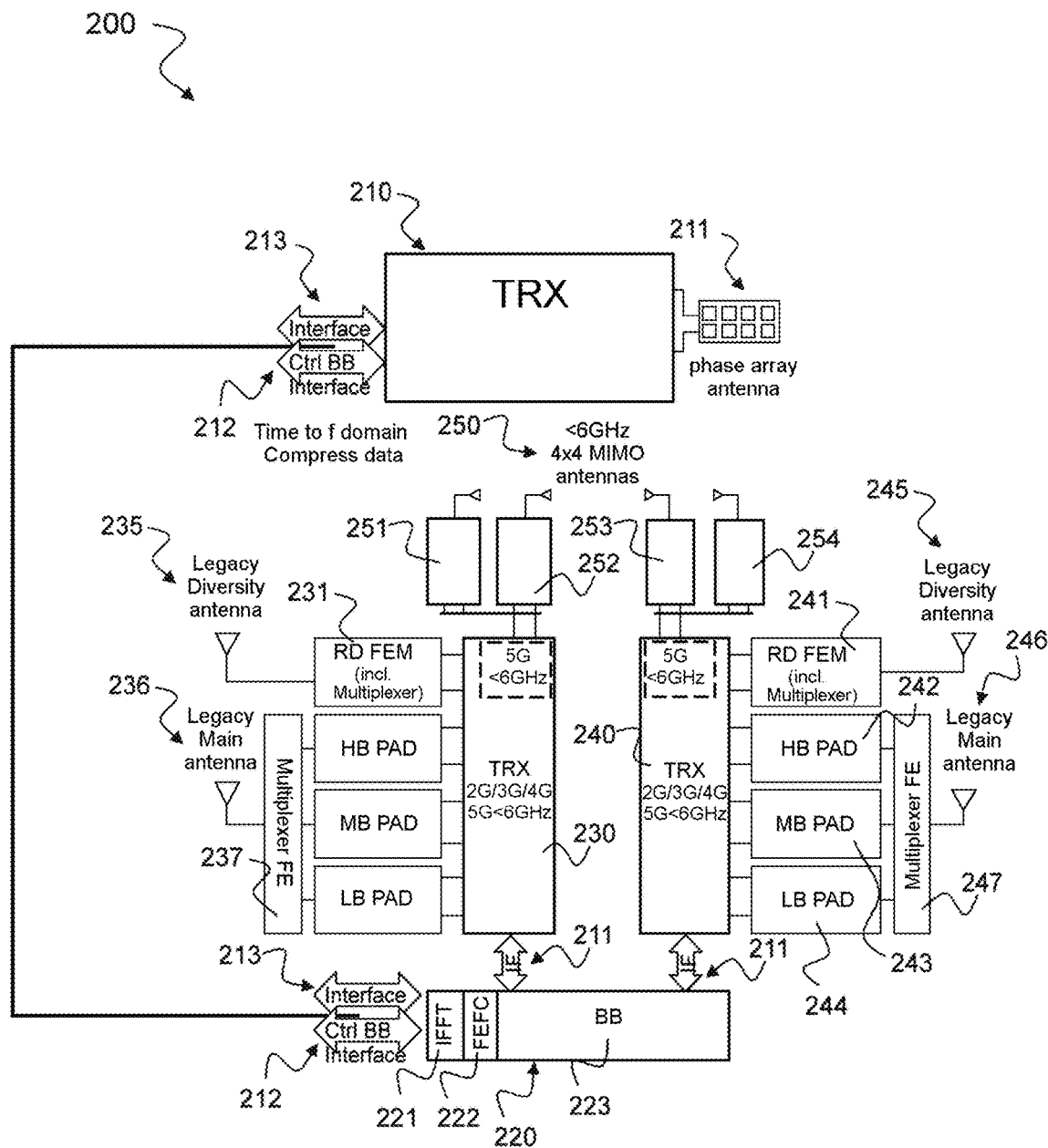
FIG. 2 is an exemplary block diagram illustrating a 5G data compressor platform architecture 200 according to the disclosure.

FIG. 2 is a block diagram illustrating 5G data compressor platform architecture 200 according to the disclosure.

The 5G data compressor platform architecture 200 may include a TRX (transceiver) 210 that receives antenna signals from a phase array antenna 211. The TRX 210 may be designed for the mm Waves and may include signal processing and compression components as highlighted in FIG. 3. The TRX 210 may include a digital front end (DFE) that converts the antenna signals into digital data which are transported via digital interface 213 to a baseband (BB) circuitry 220. Besides digital interface 213, a control BB interface 212 between TRX 210 and BB circuitry 220 may be used to transport control commands. The digital front end, DFE, is a circuitry that is employed for bridging between a radio frequency (RF) part of the TRX 210 and the digital interface 213. The DFE provides digital functions for processing the bridging. The DFE provides the digital data, e.g. in integer and/or floating point, for transmission via the digital interface 213 to the BB circuitry. At least parts of the RF and IF up/down conversions may be implemented by the DFE. The DFE may perform digital processing in time and/or frequency domain and conversion between time and frequency domain and vice versa. The BB circuitry 220 may include BB processing and peripheral components 223, a Front End and FFT component (FEFC) 222 and an IFFT function 221 to implement the decompressor component.

Besides the TRX 210 coupled via digital interface 213 to BB circuitry 220, further TRXs 230, 240 may be used to couple other antenna signals from legacy diversity antennas 235, 245, legacy main antennas 236, 246 and MIMO antennas 250, e.g. <6 GHz 4×4 MIMO antennas, via further digital interfaces 211 to BB circuitry 220. The antenna signals may be multiplexed and converted by different stages 251, 252, 253, 254, 241, 242, 243, 244, 247 as shown in FIG. 2 before being transmitted to the further TRXs 230, 240 and to the BB circuitry 220.

Figure 3:
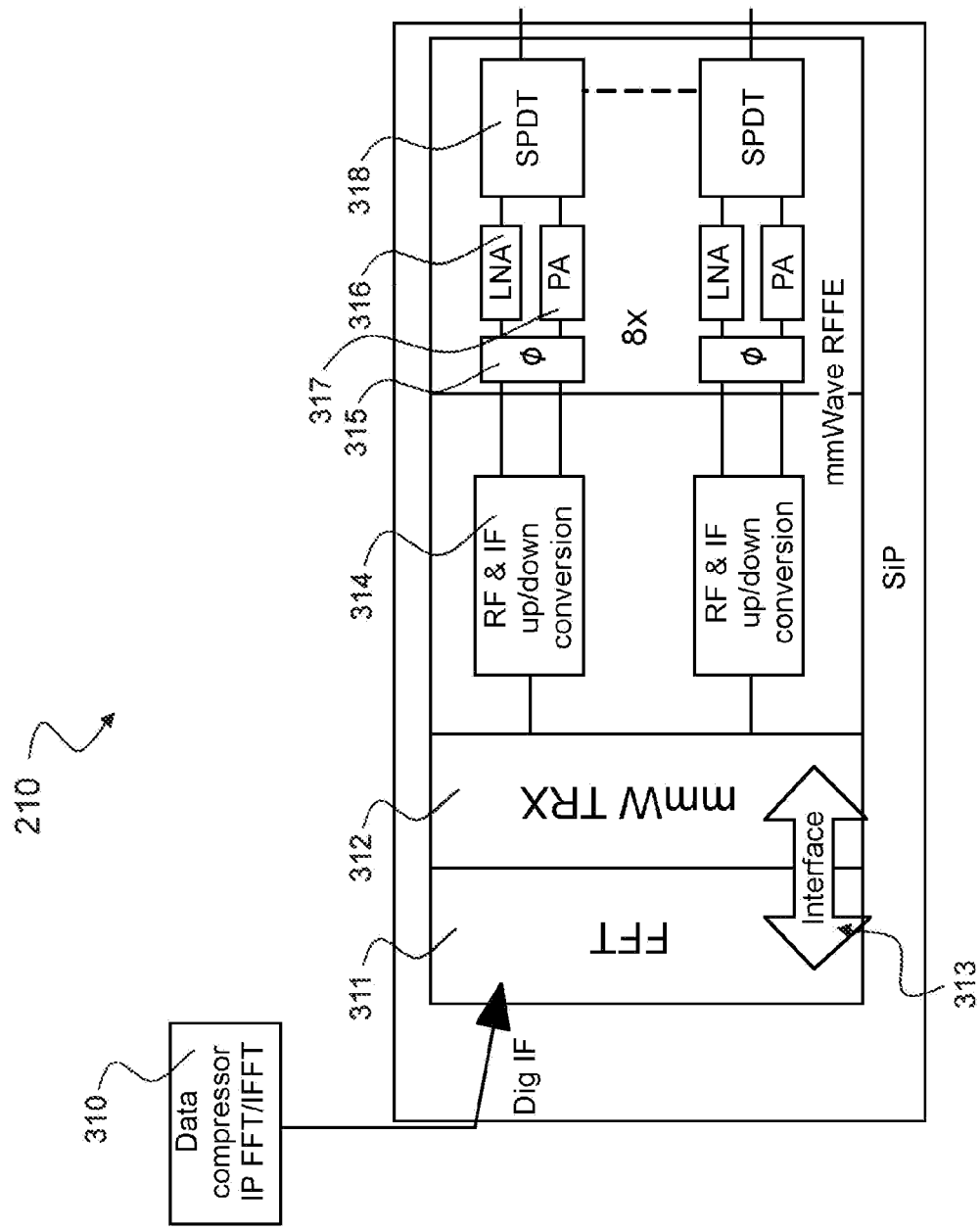
FIG. 3 is an exemplary block diagram highlighting the TRX device 210 of the 5G data compressor platform architecture 200 shown in FIG. 2.

FIG. 3 is a block diagram highlighting the TRX device 210 of the 5G data compressor platform architecture 200 shown in FIG. 2. The TRX device 210 may include a mmW TRX 312 designed for mm waves which is coupled via interface 313 to FFT function 311 which serves as data compressor 310 to provide the digital data for transport via digital interface 213 to BB circuitry 220. The antenna signals from phase array antenna 211 (see FIG. 2) may be passed to a block of mmWave RFFEs (radio frequency front ends) which include an exemplary number of 8 analog front ends, each one including SPDT (single pole double throw) analog switch 318, LNA (low noise amplifier) 316, PA (power amplifier) 317 and averaging block 315. The mmWave RFFEs may be coupled to digital front end that includes blocks for RF & IF (radio frequency and intermediate frequency) up and down conversion 314 and mmW TRX 312 to convert the analog signals into digital data. Before transported to BB circuitry 220, the digital data may be compressed via data compressor 310 using FFT function 311.

The 5G data compressor signal conversion concept comprises the integration of the partial BB functionality, in particular the FFT function 311, to the mmW TRX 312, so that the data is transmitted in the frequency domain.

Radio access technologies (RAT) based on orthogonal frequency division multiplexing (OFDM) such as 3GPP LTE or 3GPP NR may directly work with the frequency-domain samples if the transform window positioning and size comply with the respective standard.

For most general applicability of this idea with other RATs, on the BB side there may also be a data de-compressor implemented, mainly consisting of the iFFT function 221, such that the data signal is converted back to the time domain, since non-OFDM inner receiver processing needs time domain data signal for decoding and demodulation tasks.

A significant amount of information transferred via the digital mmW TRX to BB interface 213 may be dropped after the FFT 311. CP (cyclic prefix), guard band and DC content may be dropped which removes up to 50% of the samples.

Figure 4:
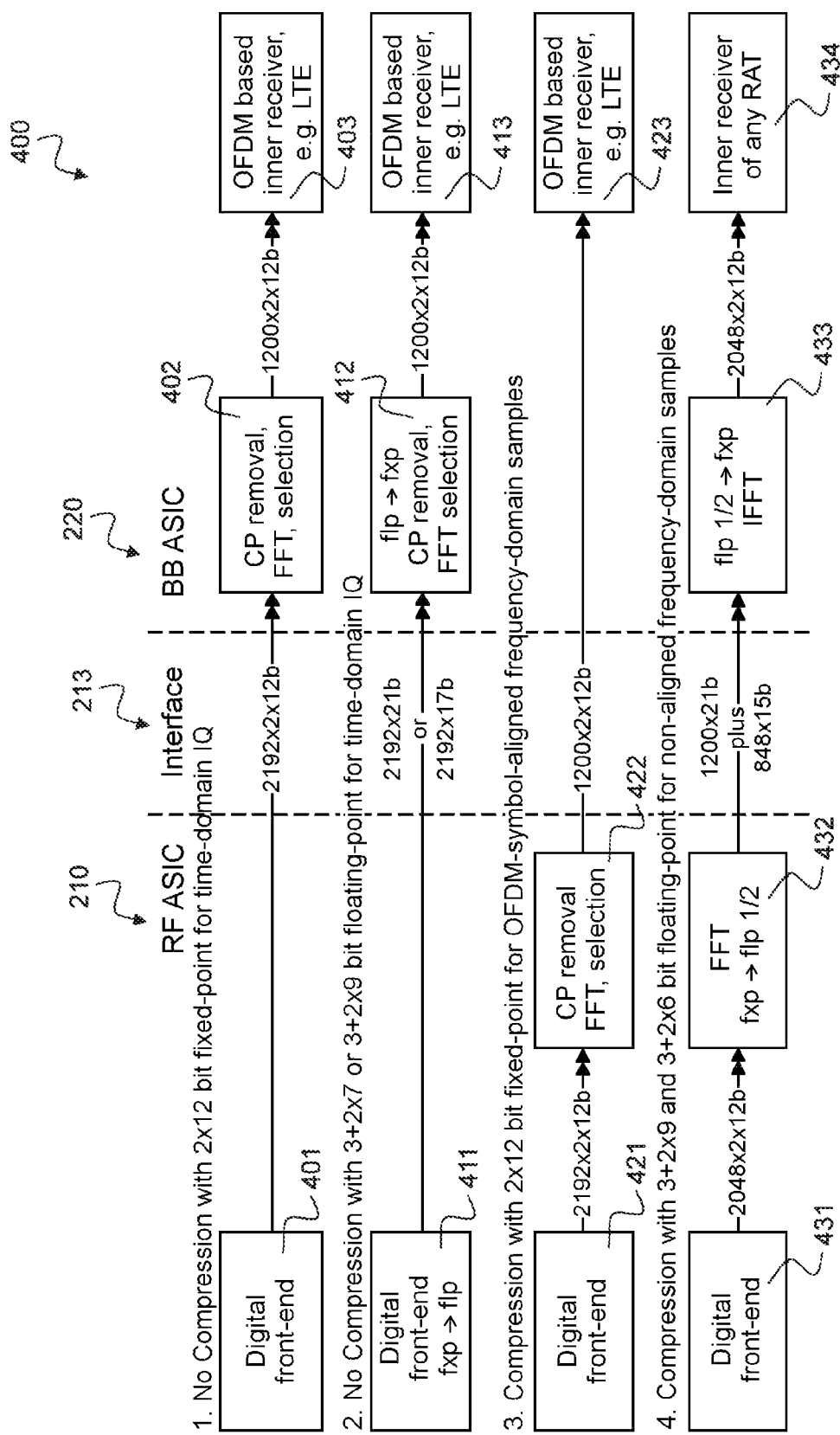
FIG. 4 is an exemplary block diagram 400 illustrating the 5G data compressor signal conversion concept according to the disclosure.

FIG. 4 is a block diagram 400 illustrating the 5G data compressor signal conversion concept according to the disclosure.

The 5G data compressor may reduce data transferred via the mmW TRX BB interface 213 (see FIGS. 2 and 3) and may enable the elimination of RF Cable interface with high BOM cost and limited scalability regarding FE head distance by mmW by introducing a lean digital BB to TRX interface. A summary of the compared and evaluated possible data transfer schemes at the mmW to BB interface 213 is depicted in FIG. 4. The numbers of samples and bit width given in the interface section between radio-frequency (RF) 210 and baseband (BB) 220 ASIC correspond to the data amount for representing one OFDM symbol. As such, the reduction of data rate can be read from comparing those numbers. Option 1 and 2 represent the non-compression states. Options 3 and 4 represent the new idea for aligned and non-aligned FFT with reduction in data rate as already presented in the previous section (see FIGS. 2 and 3).

In the non-compression state according to Option 1, the RF ASIC 210 may include digital front end 401 performing no compression with 2×12 bit fixed-point for time-domain IQ (in-phase/quadrature signals). At the interface 213 digital data of size 2192×2×12b may be transferred to BB ASIC 220 which may perform CP removal, FFT and selection 402 and transfers data of size 1200×2×12b to OFDM based inner receiver 403, e.g. LTE.

In the non-compression state according to Option 2, the RF ASIC 210 may include digital front end 411 with fixed point to floating point conversion (fxp→flp) performing no compression with 3+2×7 or 3+2×9 bit floating-point for time-domain IQ (in-phase/quadrature signals). At the interface 213 digital data of size 2192×21b or 2192×17b may be transferred to BB ASIC 220 which may perform floating point to fixed point reconversion, CP removal, FFT and selection 412 and may transfer data of size 1200×2×12b to OFDM based inner receiver 413, e.g. LTE.

In the compression state according to Option 3, the RF ASIC 210 may include digital front end 421 performing compression with 2×12 bit fixed-point for OFDM-symbol-aligned frequency domain samples by applying CP removal, FFT and selection 422. At the interface 213 digital data of size 1200×2×12b may be transferred to BB ASIC 220 which may include OFDM based inner receiver 423, e.g. LTE. Compared to Option 1, the CP removal, FFT and selection stage 402 is shifted from BB ASIC 220 to RF ASIC 210.

In the compression state according to Option 4, the RF ASIC 210 may include digital front end 431 performing compression with 3+2×9 and 3+2×6 bit floating-point for non-aligned frequency-domain samples and provides digital data of size 2048×2×12b to module (or circuitry) 432 which performs FFT and fixed point to floating-point conversion to obtain digital data of size 1200×21b plus 848×15b. This data may be transferred to BB ASIC 220 which includes module (or circuitry) 433 performing floating point to fixed-point reconversion and IFFT function. The converted data of size 2048×2×12b may be transferred to inner receiver 434 that may be of any RAT (radio access technology). Compared to Option 2, the CP removal, FFT and selection part of stage 412 is shifted from BB ASIC 220 to RF ASIC 210.

The 5G data compressor OFDM signal conversion for cellular communication in the case of OFDM-symbol-aligned transforms, i.e. time shift=0 was proven by Matlab simulation resulting in 1200/2048=0.586 reduction of data transferred via the interface 213 when the position of OFDM symbol boundary is known (lossless compressor mode).

Surprisingly, a reduction of data in compressor mode still seems possible for non-OFDM-symbol-aligned transforms, i.e. when non-zero time shifts occur (lossy compressor mode). Further, the changed reference from fixed point to floating point notation still showed a similar benefit.

Timing alignment between non compressor and compressor, as well as the timing between lossy compressor mode and (later on, after symbol sync) lossless compressor mode, can be achieved via a timing track loop and buffering (RF control loop from baseband to RF).

Results for reduction of data transferred via the interface 213 when timing and the position of the OFDM symbol boundary is not known may be as follows:

For 2×12 bit fixed point notation as baseline: (1200+848*18/24)/2048=0.896; and for 21 bit floating point notation as baseline: (1200+848*15/21)/2048=0.882.

Figure 5:
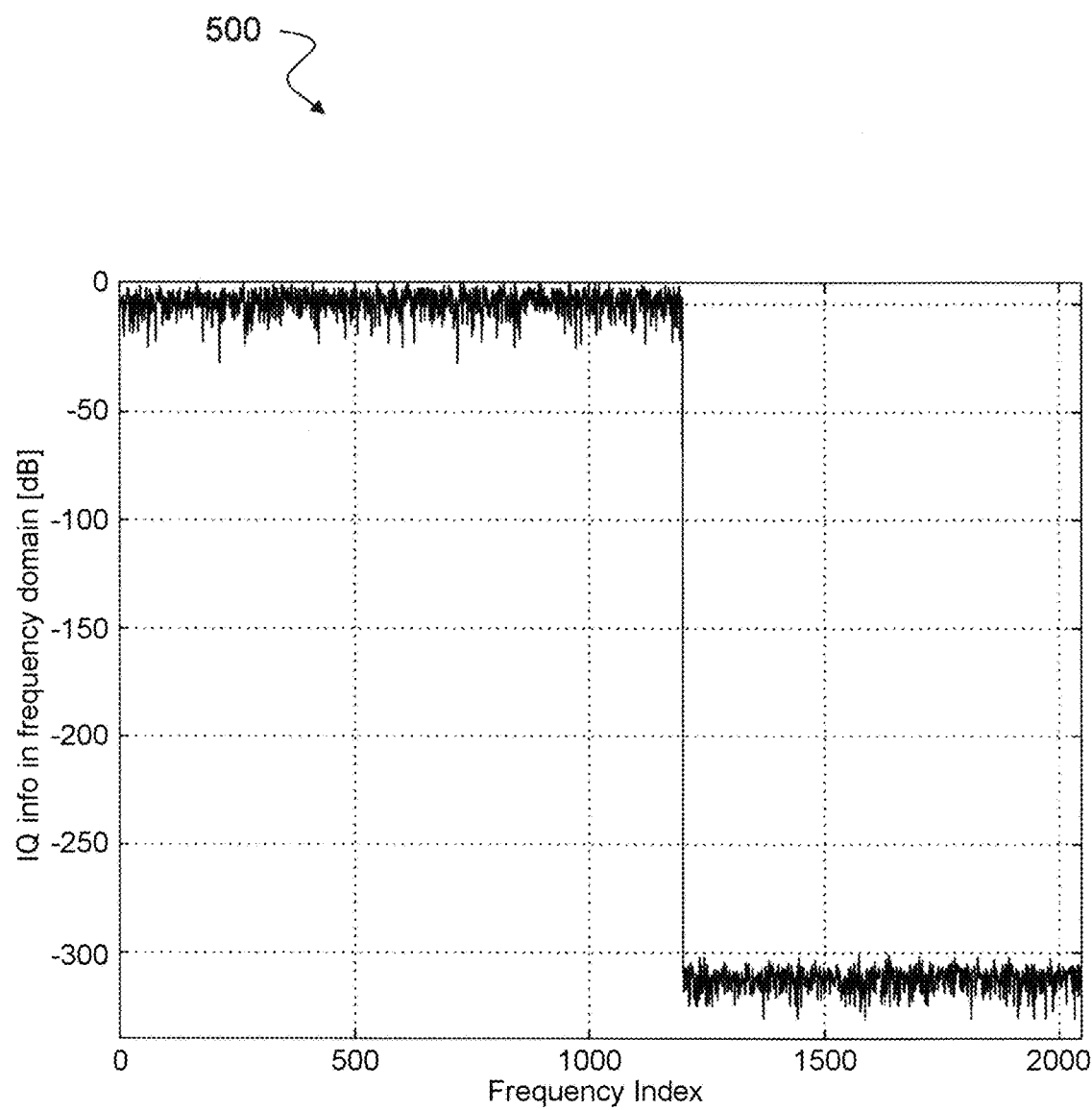
FIG. 5 is a frequency diagram 500 illustrating the spectral content along frequency axis for an exemplary OFDM aligned FFT window.

FIG. 5 is a frequency diagram 500 illustrating the spectral content along frequency axis for an exemplary OFDM aligned FFT window. FIG. 5 illustrates the situation of option 3 described above with respect to FIG. 4.

Option 3 with OFDM-symbol-aligned FFT window for compression achieves reduction of data rate by removal of both, cyclic pre-fix and unused sub-carriers which therefore gives the highest reduction. This is illustrated in FIG. 5 showing zero out-of-band spectral content so that only the 1200 sub-carriers are needed to be transmitted.

Figure 6:
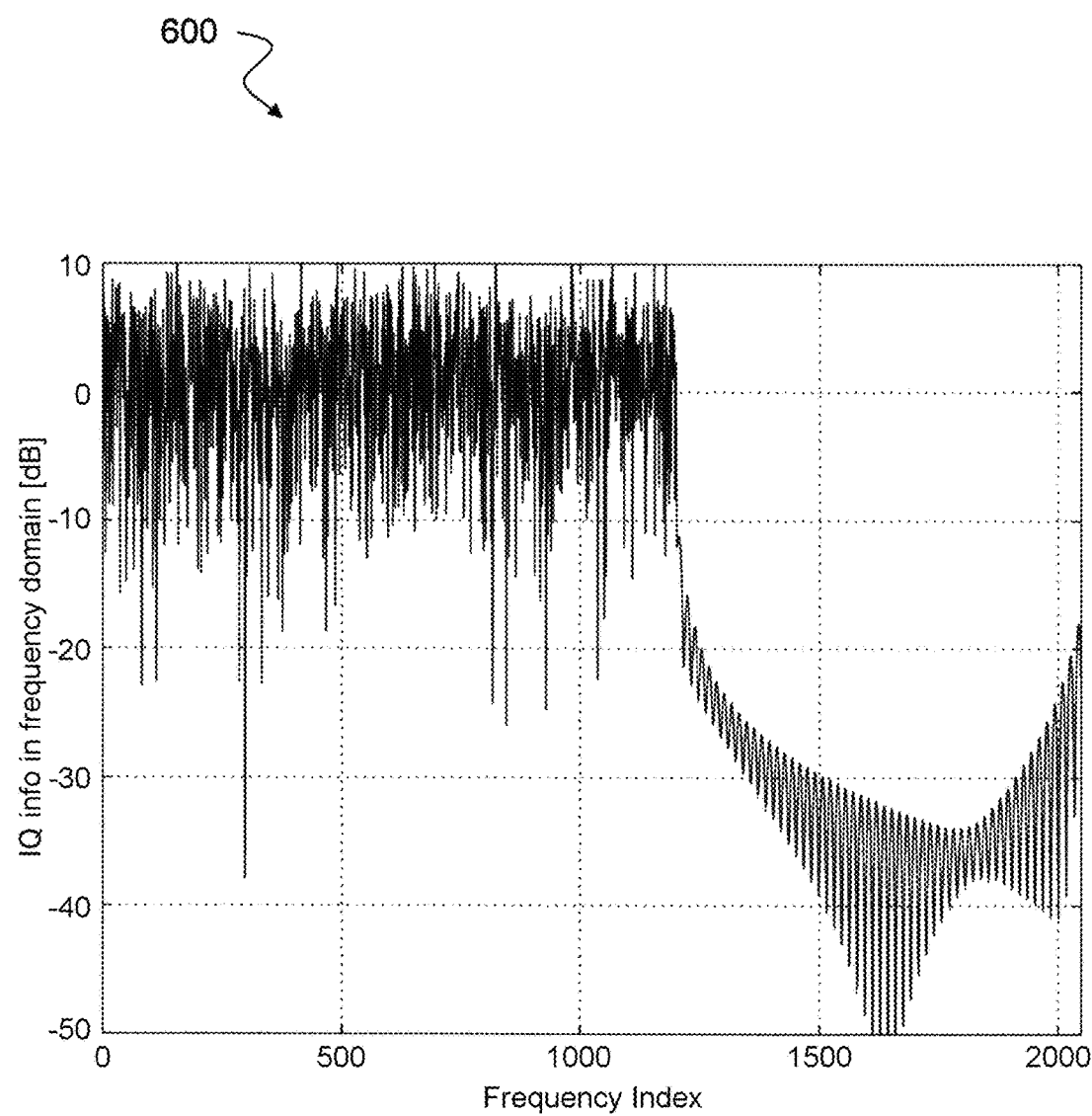
FIG. 6 is a frequency diagram 600 illustrating the spectral content along frequency axis for an exemplary non-aligned FFT window with time shift 128.

FIG. 6 is a frequency diagram 600 illustrating the spectral content along frequency axis for an exemplary non-aligned FFT window with time shift 128. FIG. 6 illustrates the situation of option 4 described above with respect to FIG. 4.

FIG. 6 shows that even for non-aligned windows with time shift, the spectral content outside the 1200 subcarriers may be approximately 18 dB lower than for the in-band subcarriers. For that reason, saving 2×3 bit per IQ pair may be possible. For the floating point format with common exponent, the preferred embodiment works with 3+2×9 bit for in-band frequency samples and 3+2×6 bit for out-of-band samples. In option 4, the compressor may consist of FFT plus frequency-dependent conversion into floating point with different word length and the decompressor consists of frequency-dependent mapping from floating point format into input format of IFFT.

Figure 7:
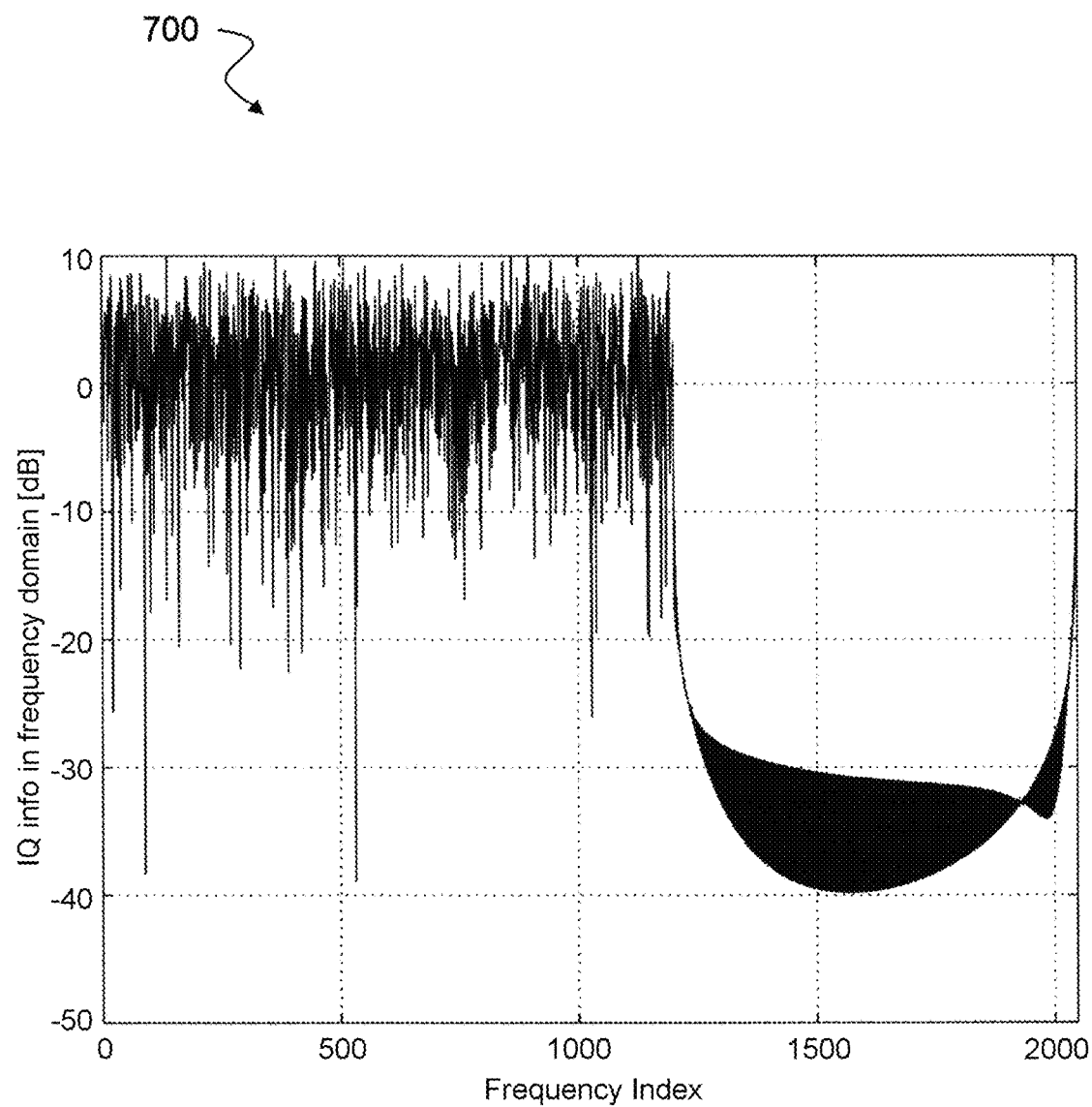
FIG. 7 is a frequency diagram 700 illustrating the spectral content along frequency axis for an exemplary non-aligned FFT window with time shift 1024 for a first snap shot.
Figure 8:
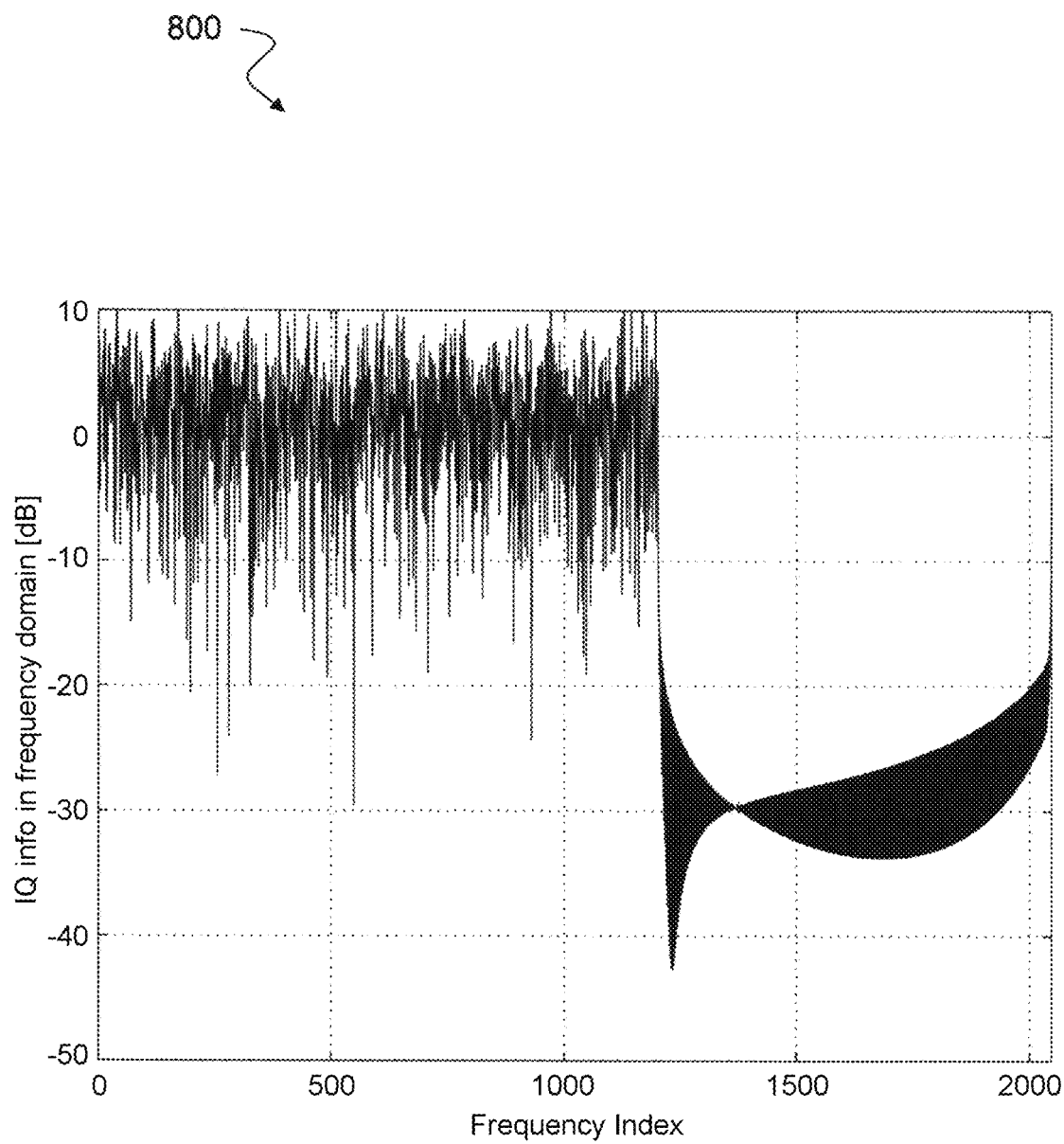
FIG. 8 is a frequency diagram 800 illustrating the spectral content along frequency axis for an exemplary non-aligned FFT window with time shift 1024 for a second snap shot.

FIGS. 7 and 8 are frequency diagrams 700, 800 illustrating the spectral content along frequency axis for an exemplary non-aligned FFT window with time shift 1024 for two different snap shots.

FIGS. 7 and 8 show the situation with worst-case time shift. It can be seen that the shape of the out-of-band signal carries information, but in both examples the spectral content is below −18 dB.

Figure 9:
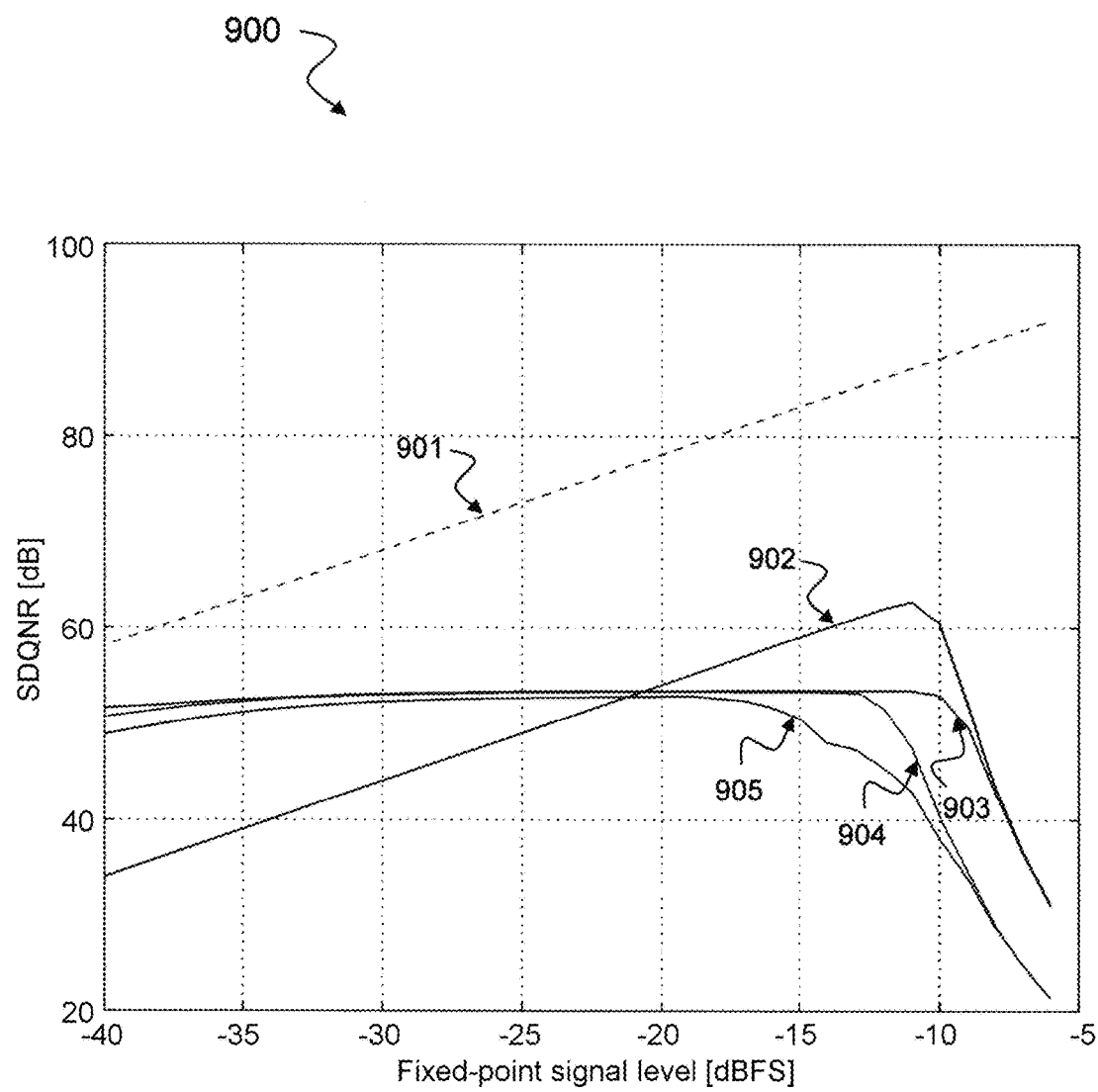
FIG. 9 is a performance diagram 900 illustrating the SDQNR (signal to digital quantization noise ratio) for an exemplary non-aligned FFT window with worst-case time shift 1024.
Figure 10:
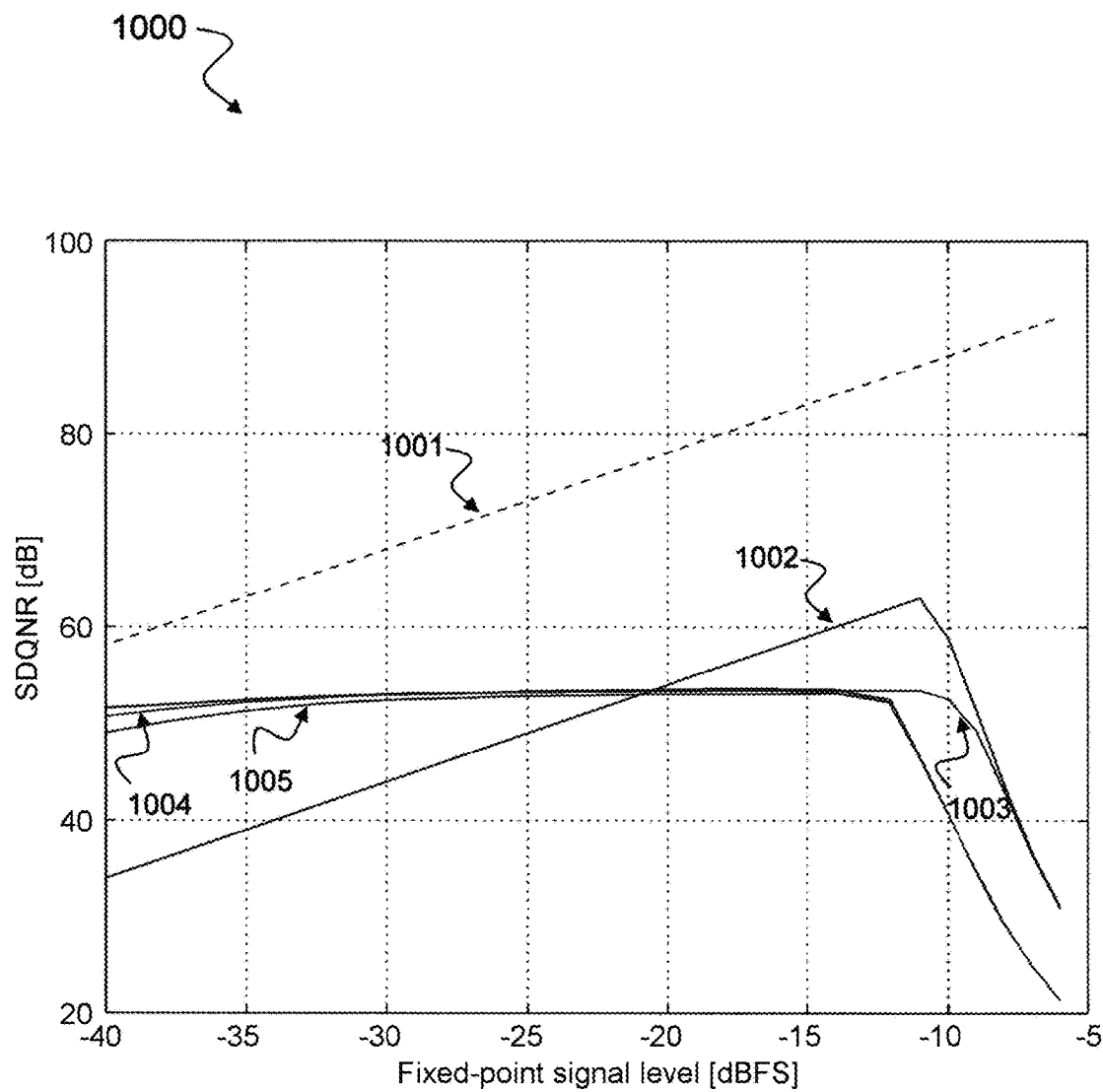
FIG. 10 is a performance diagram 1000 illustrating the SDQNR for an exemplary non-aligned FFT window with mild time shift 20.

FIGS. 9 and 10 show performance diagrams 900, 1000 illustrating the SDQNR (signal to digital quantization noise ratio) for an exemplary non-aligned FFT window with worst-case time shift 1024 (see FIG. 9) and with mild time shift 20 (see FIG. 10).

In FIG. 9, the first plot 902 represents fixed-point 2×12 bit. The second plot 903 represents floating-point 3+2×9 bit=21 bit in time-domain. The third plot 904 represents floating-point 3+2×9 bit=21 bit in frequency-domain. The fourth plot 905 represents floating-point 3+2×9 bit=21 bit and 3+2×6 bit=15 bit in frequency-domain. Plot 901 is the reference.

In FIG. 10, the first plot 1002 represents fixed-point 2×12 bit. The second plot 1003 represents floating-point 3+2×9 bit=21 bit in time-domain. The third plot 1004 represents floating-point 3+2×9 bit=21 bit in frequency-domain. The fourth plot 1005 represents floating-point 3+2×9 bit=21 bit and 3+2×6 bit=15 bit in frequency-domain. Plot 1001 is the reference.

FIGS. 9 and 10 represent Matlab link simulation results for signal-to-digital-quantization-noise ratio (SDQNR). FIGS. 9 and 10 show achievable signal quality for different time shifts. It can be seen that with compression, 52 dB can be achieved corresponding to EVM=0.25% when computing EVM $[\%]=100\% \cdot 10^{EVM\ [dB]/20}$. This signal quality can be maintained for wide range of fixed-point signal level at the input. With typical RF signal quality below 40 dB, the compression leads to negligible degradation of the signal quality.

Figure 11:
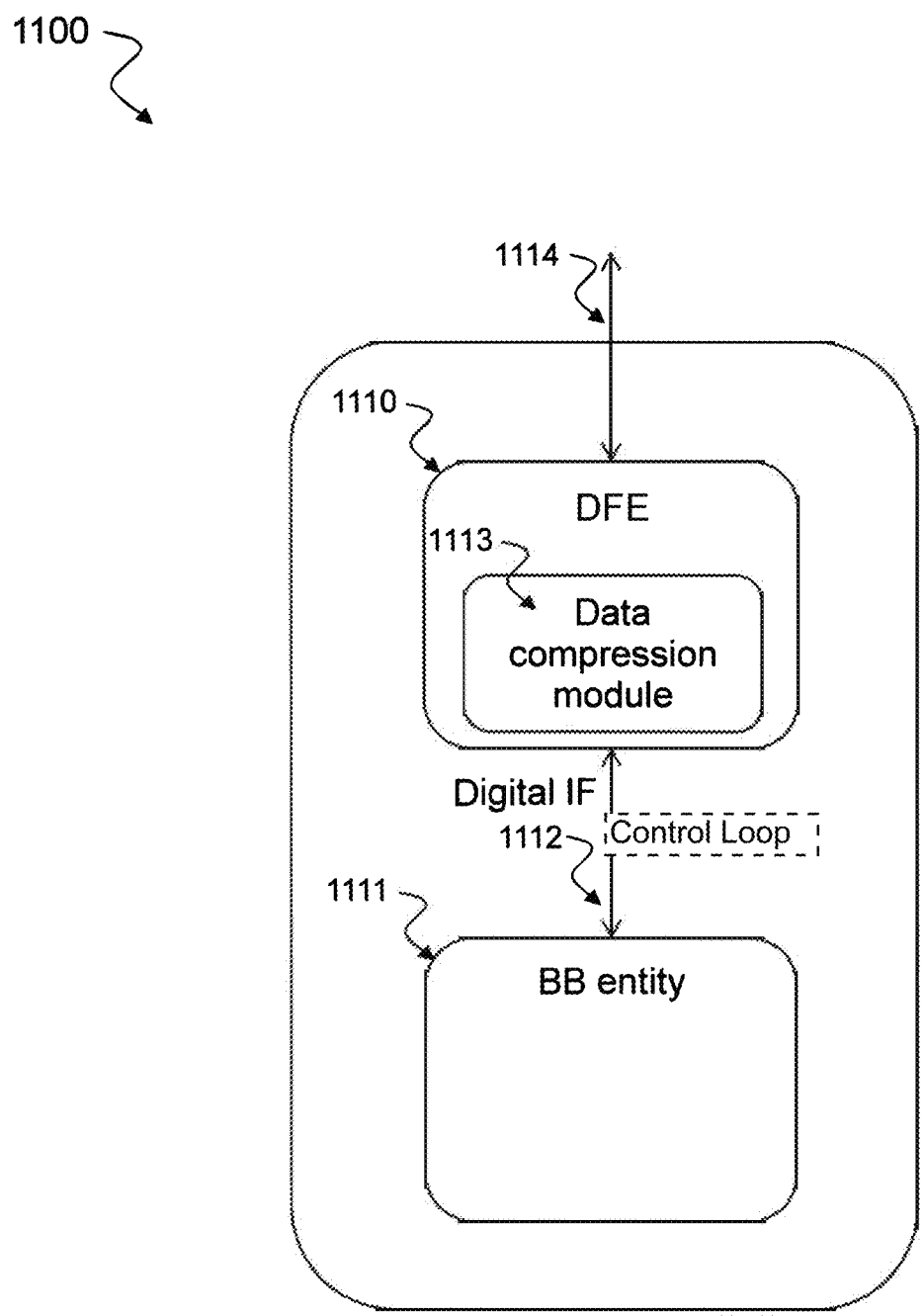
FIG. 11 is a block diagram illustrating a data processing device 1100 according to the disclosure.

FIG. 11 is a block diagram illustrating a data processing device 1100 according to the disclosure. The data processing device describes a high-level block diagram of a user equipment (UE), e.g. the UE 110 described above with respect to FIG. 1, in particular a UE using the 5G data compressor platform architecture 200 as described above with respect to FIGS. 2 and 3.

The data processing device 1100 may include a digital front end (DFE) 1110, a baseband circuitry 1111 and a digital interface 1112 between DFE 1110 and BB circuitry 1111. The DFE 1110 may be configured to convert an antenna signal 1114 to digital data, wherein the digital data comprises a plurality of data symbols. The BB circuitry 1111 may be configured to process the digital data in baseband. The digital interface 1112 is an interface between the DFE 1110 and the BB circuitry 1111. The DFE 1110 may comprise a data compression circuitry 1113 configured to compress the plurality of data symbols for use in transmission via the digital interface 1112 to the BB circuitry 1111. The data compression circuitry may be implemented as a hardware circuitry and/or in software, e.g. as a program including a sequence of commands, for example configured to implement a specific algorithm. The BB circuitry may be implemented as a hardware circuitry and/or in software.

The DFE 1110 may be part of a RF ASIC 210 or TRX circuit 210 as described above with respect to FIGS. 2 to 4. For example, the DFE 1110 may correspond to the blocks 311, 312, 314 as illustrated in FIG. 3 which are configured to perform the digital processing of the TRX 210 (shown in FIGS. 2 and 3). The digital interface may correspond to the digital interface 213 as described above with respect to FIGS. 2 to 4. The BB circuitry 1111 may correspond to the BB circuitry 220 described above with respect to FIGS. 2 to 4.

The data compression circuitry 1113 may comprise a Fast Fourier Transform (FFT) entity (or circuitry) configured to perform a compression of the plurality of data symbols, e.g. as described above with respect to FIGS. 2 to 4. In particular, the FFT entity (or circuitry) may correspond to the FFT module (or circuitry) 311 shown in FIG. 3.

The plurality of data symbols may comprise a plurality of Orthogonal Frequency Division Multiplex (OFDM) symbols.

The digital interface 1112 may be configured to transmit frequency domain samples of the plurality of data symbols between the DFE and the BB circuitry.

The data compression circuitry 1113 may be configured to compress the plurality of data symbols based on a removal of at least one of a cyclic prefix and an unused subcarrier. This may be realized by the FFT entity (or circuitry).

The data compression circuitry 1113 may be configured to compress the plurality of data symbols based on using different word lengths for inband FFT samples and out-of-band FFT samples.

The data compression circuitry 1113 may be configured to compress the plurality of data symbols based on lossless compression when the data compression circuitry is operated in a lossless compressor mode, e.g. as described above with respect to FIGS. 2 to 4.

The data compression circuitry 1113 may be configured to compress the plurality of data symbols into OFDM symbol-aligned frequency domain samples when the data compression circuitry is operated in the lossless compressor mode, e.g. as described above with respect to FIGS. 2 to 4.

A symbol boundary position of the OFDM symbol-aligned frequency domain samples may be known when the data compression circuitry 1113 is operated in the lossless compressor mode, e.g. as described above with respect to FIGS. 2 to 4.

The data compression circuitry 1113 may be configured to compress the plurality of data symbols based on lossy compression when the data compression circuitry is operated in a lossy compressor mode, e.g. as described above with respect to FIGS. 2 to 4.

The data compression circuitry 1113 may be configured to compress the plurality of data symbols into non-OFDM symbol-aligned frequency domain samples when the data compression circuitry is operated in the lossy compressor mode, e.g. as described above with respect to FIGS. 2 to 4.

The data processing device 1100 may include a control loop arranged between the BB circuitry 1111 and the DFE 1110. The control loop may be configured to time-align the compressed data symbols with non-compressed data symbols, e.g. as described above with respect to FIGS. 2 to 4.

The control loop may be configured to time-align the compressed data symbols in lossless compressor mode with the compressed data symbols in lossy compressor mode, e.g. as described above with respect to FIGS. 2 to 4.

The DFE 1110 may be configured to transceive a millimeter wave antenna signal as described above with respect to FIGS. 1 to 4.

Figure 12:
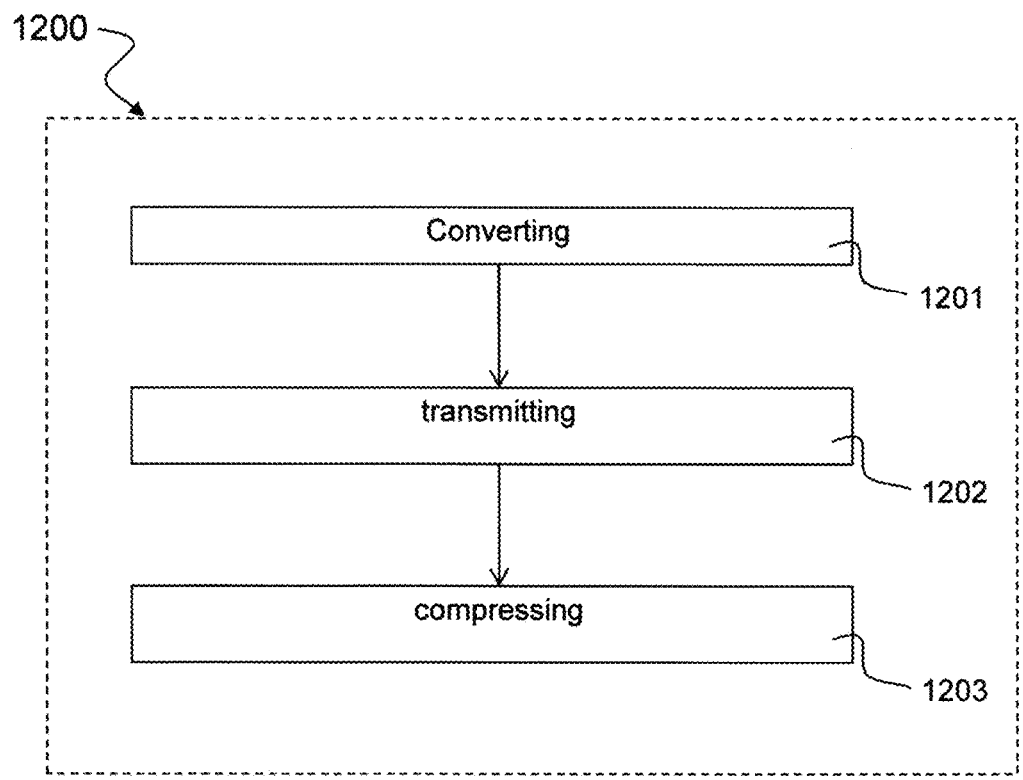
FIG. 12 is a schematic diagram illustrating a method 1200 for transmitting data symbols between a digital front end (DFE) and a baseband (BB) circuitry according to the disclosure.

FIG. 12 is a schematic diagram illustrating a method 1200 for transmitting data symbols between a digital front end (DFE) and a baseband (BB) circuitry according to the disclosure. The method can be applied in a data processing device 1100 as described above with respect to FIG. 10 or in a user equipment (UE), e.g. the UE 110 described above with respect to FIG. 1, in particular a UE using the 5G data compressor platform architecture 200 as described above with respect to FIGS. 2 and 3.

The method 1200 comprises: converting 1201 an antenna signal to digital data by the DFE, wherein the digital data comprises a plurality of data symbols; transmitting 1202 the plurality of data symbols from the DFE to the BB circuitry by a digital interface arranged between the DFE and the BB circuitry; and compressing 1203 the plurality of data symbols for use in transmission via the digital interface, e.g. as described above with respect to FIGS. 2 and 3.

The method 1200 may comprise: performing the compression of the plurality of data symbols based on a Fast Fourier Transform (FFT).

The plurality of data symbols may comprise a plurality of Orthogonal Frequency Division Multiplex (OFDM) symbols.

The method 1200 may comprise: transmitting frequency domain samples of the plurality of data symbols via the digital interface.

The method 1200 may comprise: compressing the plurality of data symbols based on a removal of at least one of a cyclic prefix and an unused subcarrier, e.g. as described above with respect to FIGS. 2 to 4.

The method 1200 may comprise compressing the plurality of data symbols based on using different word lengths for inband FFT samples and out-of-band FFT samples, e.g. as described above with respect to FIGS. 2 to 4.

As described above with respect to FIG. 1, in this disclosure, two types of IQ sample compression methods in different scales are disclosed: one is bit-wise compression and the other is symbol-wise (see FIGS. 13 to 27).

For bit-wise compression, the OFDM modulated signal is well-known to be Gaussian distributed, while the SC-FDMA signal can be Gaussian approximated. This means that the signal of interest does not have a uniform distribution.

Therefore, the application of a non-uniform compression/quantization with optimized distances between the quantization level may result in lower quantization error in terms of EVM and better compression efficiency. This bit-wise compression is conducted with small block size. Both lossless and lossy compression algorithms are described in the following.

For symbol-wise compression, it is due to narrow occupied bandwidth, oversampling, and in the SC-FDMA case, DFT operation (spreading a modulation symbol to multiple subcarriers) that the data symbols are correlated over time with each other. Exploiting the redundancy in samples, the symbol-wise compression is to reduce the number of samples per data block (consisting of multiple samples) block by block.

Figure 13:
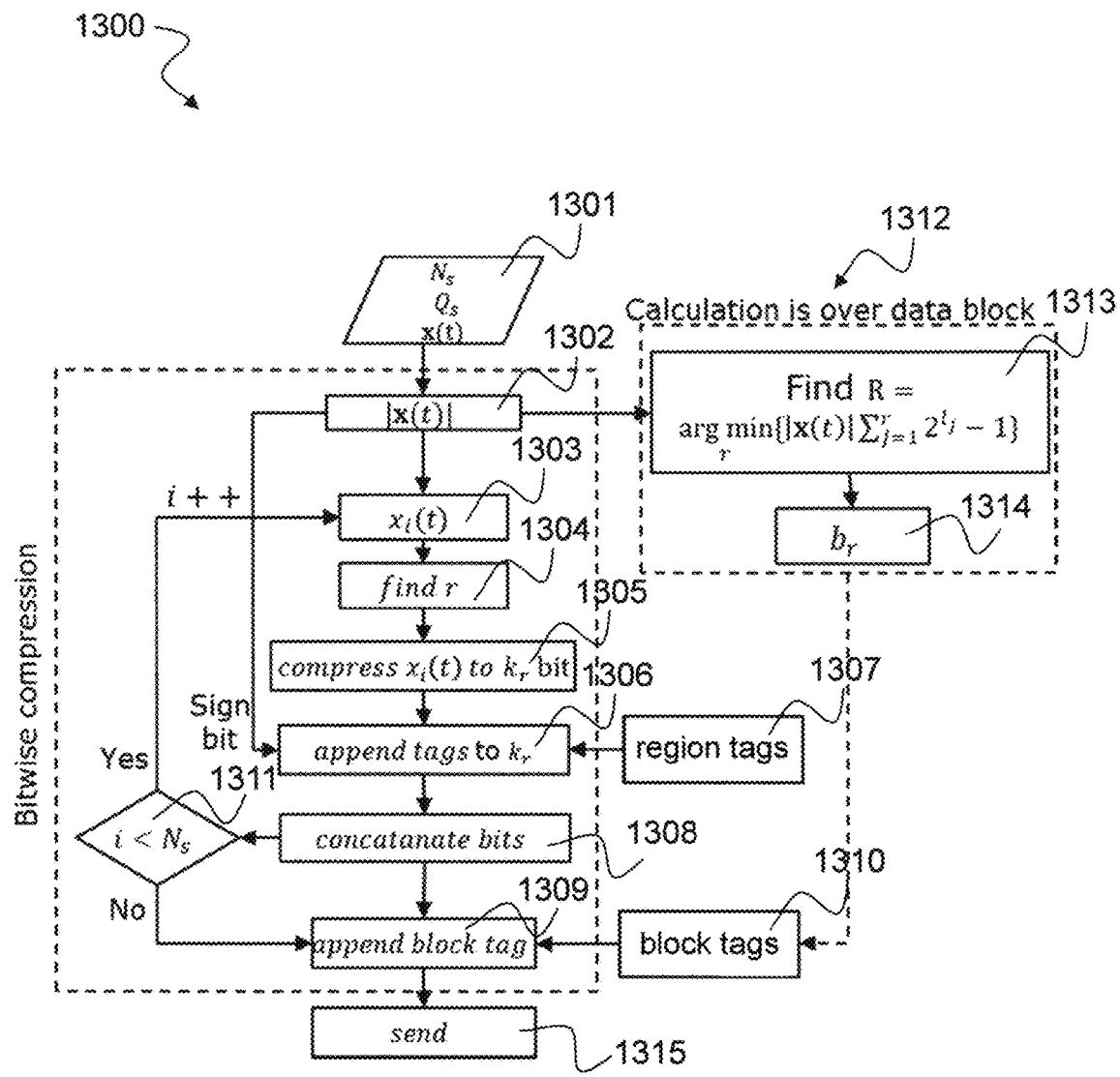
FIG. 13 is an exemplary flow chart of a lossless bitwise compression algorithm 1300 according to the disclosure.
Figure 14:
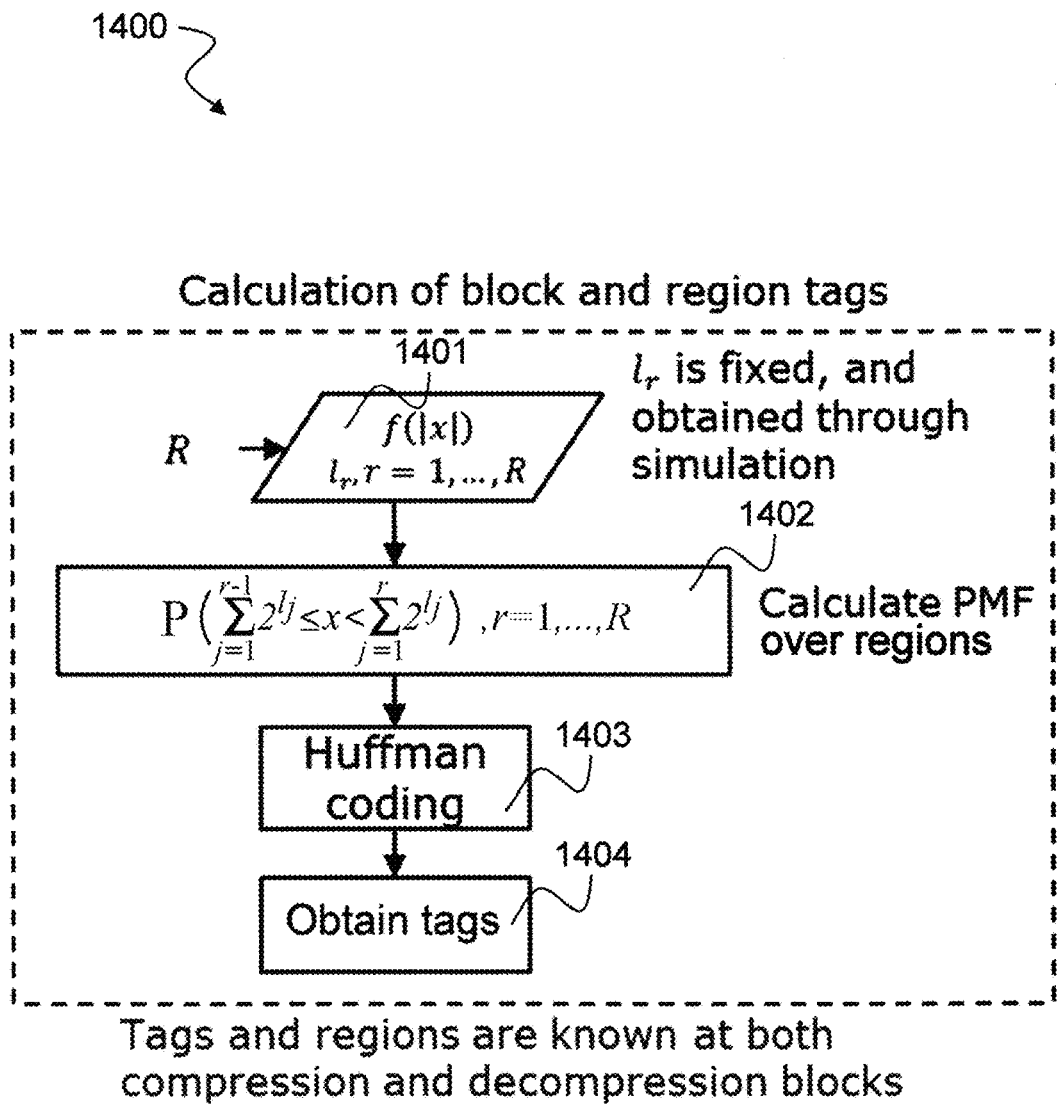
FIG. 14 is an exemplary flow chart of block and region tags calculation 1400 for the lossless bitwise compression algorithm 1300 shown in FIG. 13.

FIG. 13 is a flow chart of a lossless bitwise compression algorithm 1300 according to the disclosure and FIG. 14 is a flow chart of corresponding block and region tags calculation 1400. The bit-wise compression may take advantage of non-uniform distribution of signal.

In the following, the bit-wise lossless compression method 1300 is described considering that the data is non-uniformly distributed, for example in mm wave systems, regardless of system bandwidth and allocated bandwidth. In the beginning 1301 we have a signed data block of size $N_s$. We also assume that the probability distribution function $f(x)$ of the data is known and data values are represented by $Q_s$-bit signed such that the most significant bit (MSB) represent sign of the data (e.g., MSB=0 for positive values, MSB=1 for negative values). We denote data block by x(t) where t indicates block index.

The compression algorithm 1300 can be specified as follows: Since we consider signed representation of data values, we keep the most significant bit and apply compression on the absolute values. In other words, we apply the compression algorithm 1300 to $Q_s-1$ bit of data values while delivering sign bit as it is 1302.

First block 1400 of compression algorithm, i.e. determining regions and tags of each data (see flow chart of FIG. 14 for details): For $Q_s-1$ bit, we define regions r=1, . . . , R with region size $2^{l_r}$ where $l_r$ is a positive integer. We define $2^{l_0}=0$. Region r represents data values between $\Sigma_{j=1}^{r-1} 2^{l_j}$ and $\Sigma_{j=1}^{r} 2^{l_j}-1$. By doing so, we can represent values in region r with less number of bit than $Q_s-1$ bit. However, we need to indicate region of each data that it belongs to for de-compression algorithm. For that, we attach a tag at the beginning of each data elements to indicate the region indexr. In order to make overall compression algorithm efficient, we use for example Huffman coding 1403 to minimize average bit size of the tags. For that purpose, we compute probability mass function 1402 of the regions using known probability distribution function of absolute values of data $f(|x|)$ 1401 in an offline manner. Then, using Huffman coding 1403, we obtain bit size of tags 1404 according to the probability mass function (higher probability means small tag bit, lower probability means longer tag bit). In addition, at the beginning of data we append a tag which indicates the largest region index of data block so that we can apply smaller tags when we have small number of region in a given data block.

Second block of compression algorithm, i.e. performing compression: After defining regions and their tags which is fixed for all data blocks, we consider two options for the bit width $b_r$ (see block 1314) of regions: i) fixed, or ii) adaptive bit width.

i) Fixed bit-width: Data value 1303 in region r 1304 is represented by $l_r$ bit after subtracting $\Sigma_{j=1}^{r-1} 2^{l_j}$ from the data, i.e., $k_r=l_r$. Note that the subtraction reduces required number of bits (see block 1305). Since tag of the region 1307 is attached 1306 at the beginning of data, de-compression algorithm can add back $\Sigma_{j=1}^{r-1} 2^{l_j}$ without any ambiguity.

ii) Adaptive bit-width: In this case, we first find the maximum of data falls in region r 1304 in the data block 1303, and then compute the maximum required number of bits as follows:

$$b_r(t) = \left\lceil \log_2\left(\max\left\{x(t): \sum_{j=1}^{r-1} 2^{l_j} \le x(t) < \sum_{j=1}^{r} 2^{l_j}\right\} - \sum_{j=1}^{r-1} 2^{l_j}\right)\right\rceil$$

Note that $b_r(t)$ depends on the data block t and can be different at each block. $\lceil \cdot \rceil$ is a rounding up operation to smallest integer. Therefore, we need to indicate the size of $b_r(t)$ 1314 at the beginning of data block as a block tag 1310. In addition, dynamic range is sometimes lower than the maximum dynamic range. In this case, we use less number of regions and smaller tag bits. Note that we select either fixed bit-width or adaptive bit-width for each region according to f(|x|) and simulations.

Figure 15:
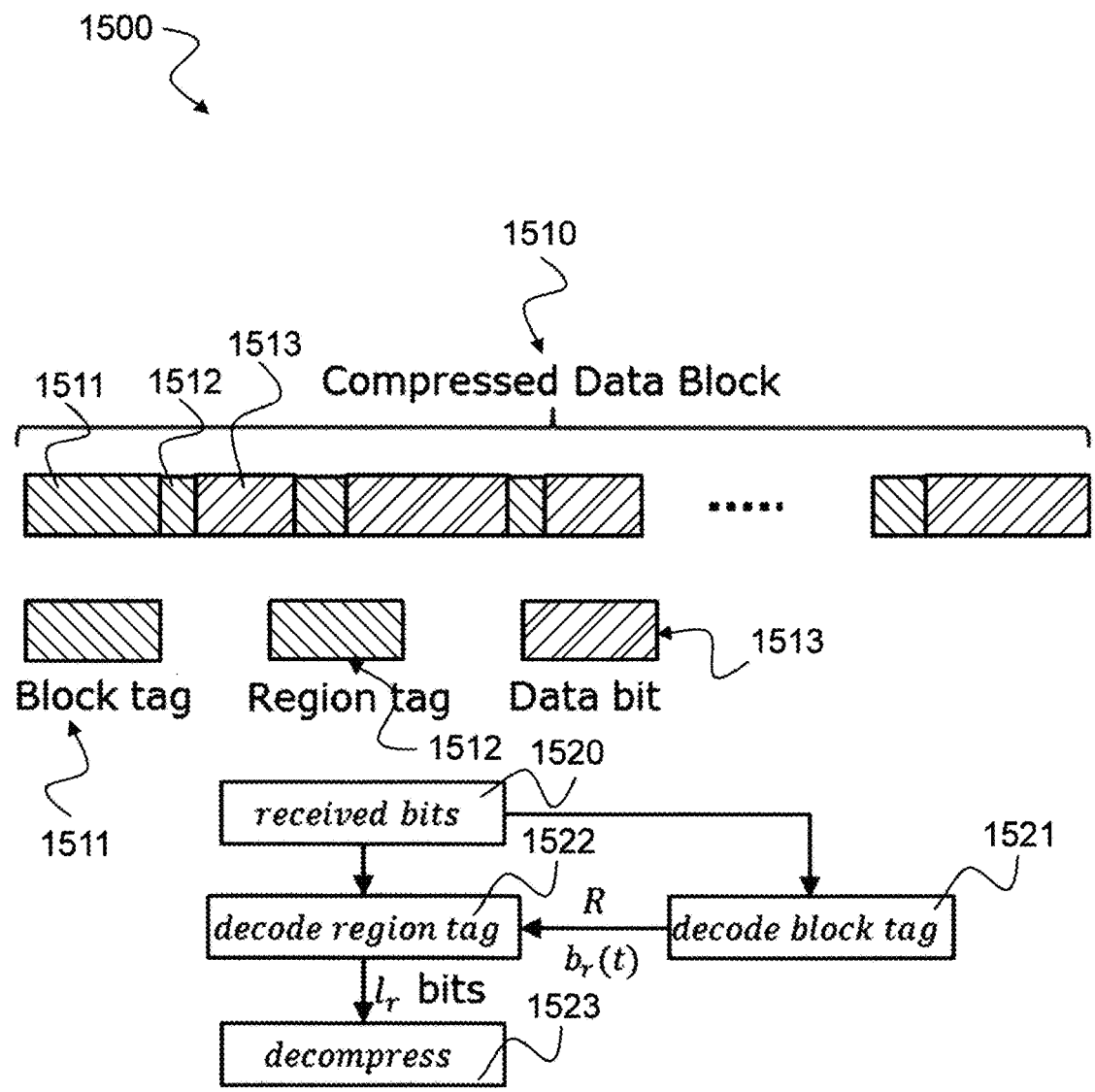
FIG. 15 is an exemplary flow chart of a lossless bitwise de-compression algorithm 1500 according to the disclosure.

FIG. 15 is a flow chart of a lossless bitwise de-compression algorithm 1500 according to the disclosure. A compressed data block 1510 is received which includes block tags 1511, region tags 1512 and data bits 1513. From the received bits 1520 block tag is decoded 1521 which may be used to decode region tag 1522 and to decompress 1523 the received bits.

The de-compression algorithm 1300 can be specified as follows:
i) First, decompression algorithm 1500 decodes block tag 1521 which indicates, the total number of regions $R_r$ and block dependent $b_r(t)$ if any adaptive bit-width is used. Note that the bit width of block tag 1511 is predefined so that de-compression algorithm 1500 knows how many bits are reserved for block tag.
ii) After decoding block tag 1521, de-compression algorithm 1500 knows region tags 1522 and reserved bit-width of each region. Therefore, the algorithm looks for element tags which are prefix free due to Huffman coding. Then, according to these tags, it takes $l_r$ bits and adds $\Sigma_{j=0}^{r-1} 2^j$ to it to get actual data value (see decompress block 1523). Finally, it appends zero bits to MSB to get $Q_s$ bit. Note that we assume that the number of regions and block tags are known between compression blocks and de-compression blocks.

Figure 16:
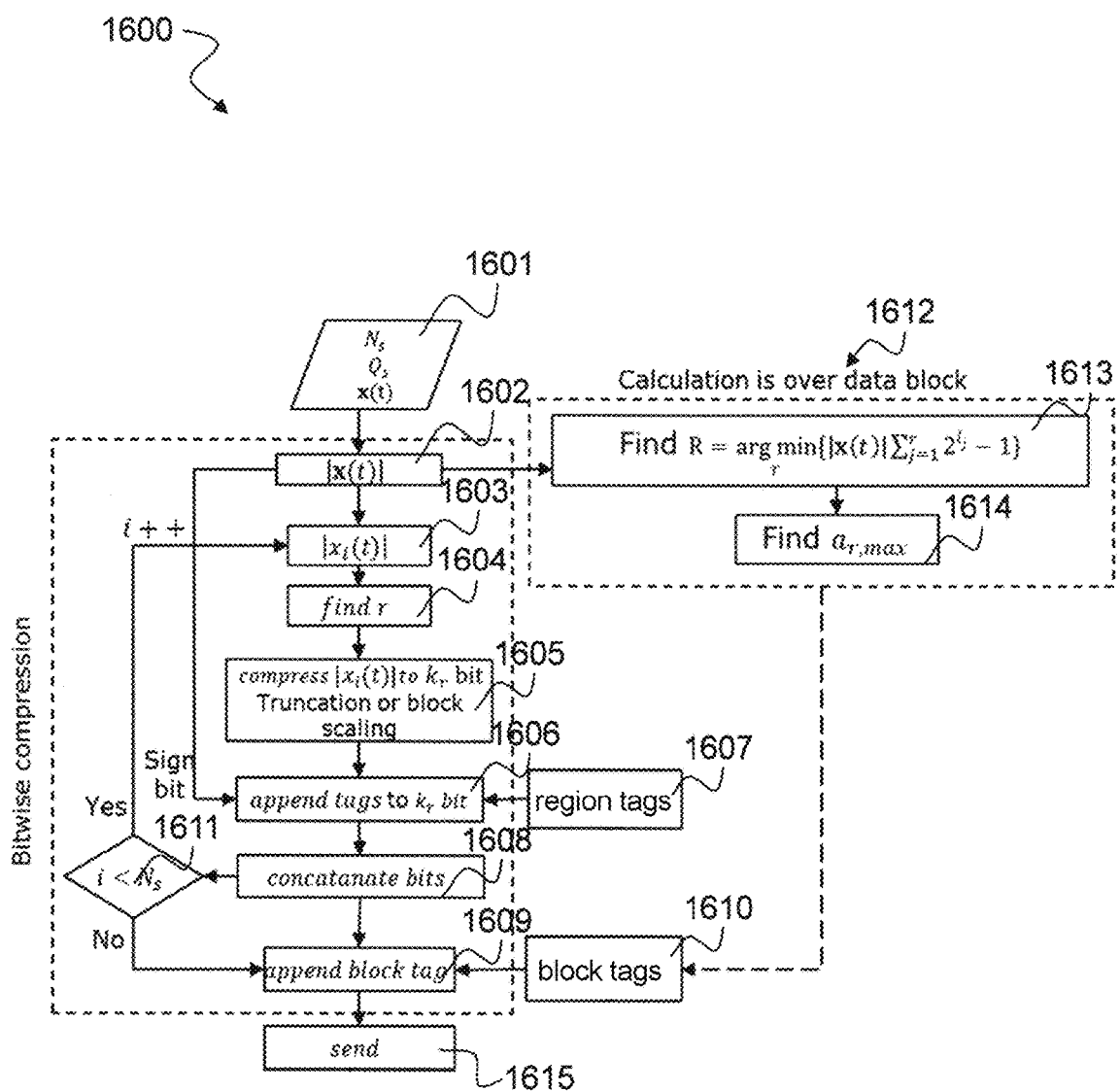
FIG. 16 is an exemplary flow chart of a low complexity lossy bitwise compression algorithm 1600 according to the disclosure.

FIG. 16 is a flow chart of a low complexity lossy bitwise compression algorithm 1600 according to the disclosure. This method may be similar to the previously described method (see FIGS. 13 to 15), but for some regions we apply truncation to further reduce the number of bits and use block scaling. The basic components of the algorithm are described in the following.

The Compression algorithm 1600 can be specified as follows: Similar to lossless compression method 1300, we consider signed 2's complement representation of data values, compress only absolute value of data, i.e., least significant $Q_s-1$ bit of data.

For first block 1612 of compression algorithm, i.e. determining regions and tags of each data the same method provided in lossless method is applied. Note that the number of regions and thus region tags can be different.

For second block 1612 of compression algorithm, i.e. compression, after defining regions and their tags which is fixed for all data blocks (known at compression and decompression blocks), we consider two options for compression at regions: i) fixed bit width with truncation, or ii) quantized block scaling.

For the first option, i.e. fixed bit-width truncation, data value in region r is truncated to $k_r$ bit, ($k_r \geq l_r$). After subtracting $\sum_{j=1}^{r-1} 2^{l_j}$, which is lower boundary of region r, from the data value, we divide it by $2^{l_r - k_r}$ and apply rounding operation as follows:

$$x_q = \text{round}\left(\frac{x - \sum_{j=1}^{r-1} 2^{l_j}}{2^{l_j - k_r}}\right),$$

where $x_q$ is truncated data. Note that we find optimal $k_r$ using probability distribution function $f(|x|)$.

For the second option, i.e. quantized block scaling, we first find scaling factor $a_{r,max}$ which is the maximum of data values in region r for a given data block t as follows:

$$a_{r,max}(t) = \max\left\{x(t): \sum_{j=1}^{r-1} 2^{l_j} \leq x(t) < \sum_{j=1}^{r} 2^{l_j}\right\} - \sum_{j=1}^{r-1} 2^{l_j}$$

Here, in order to reduce complexity, we can round up $a_{r,max}(t)$ to the closest power of 2, i.e. $a_r = \log_2 a_{r,max}(t)$ Then, we quantize the data to $k_r$ bit after scaling by $a_{r,max}(t)$ $$x_q = \text{round}\left(\frac{x - \sum_{j=1}^{r-1} 2^{l_j}}{2^{a_r - k_r}}\right).$$

We append scaling factor at the beginning of each data block for de-compression algorithm. Note that in the above method, block scaling and truncation is lossy. Therefore, we expect non-zero EVM after de-compression.

Figure 17:
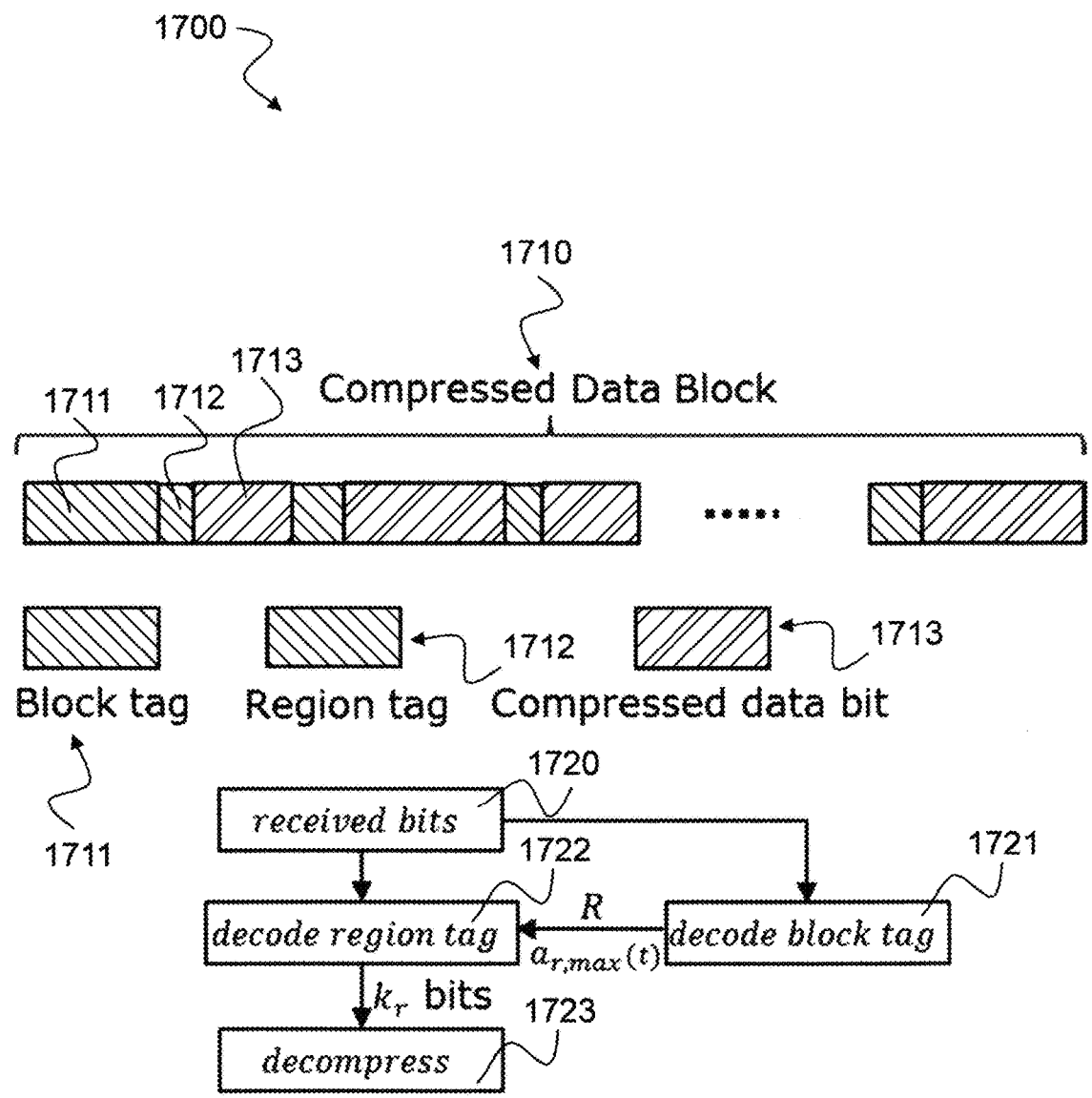
FIG. 17 is an exemplary flow chart of a low complexity lossy bitwise de-compression algorithm 1700 according to the disclosure.

FIG. 17 is a flow chart of a low complexity lossy bitwise de-compression algorithm 1700 according to the disclosure.

The de-compression algorithm is similar to lossless compression. The decompression algorithm 1700 first decodes block tag 1721 to get the number of regions and scaling factor if block scaling is used. Then, it applies following decompression for each sample according to their region and corresponding compression scheme:

In the case of fixed bit-width truncation, we expand $k_r$ bit to $l_r$ bit by adding $l_r - k_r$ zeros as least significant bit. Then, we also append zero bits as MSB to get $Q_s$ bit. Then, we add back $\sum_{j=0}^{r-1} 2^j$ to the decompressed data.

In the case of block scaling, we multiply data by scaling factor $2^{a_r - k_r}$ which is obtained from the block tag as follows:

$$\hat{x} = 2^{a_r - k_r} x_q$$

Then, we quantize the data to $l_r$ bit and append $Q_s - l_r$ zero bits as MSB to get $Q_s$ bit. Then, we add back $\sum_{j=0}^{r-1} 2^j$ to the decompressed data.

Figure 18:
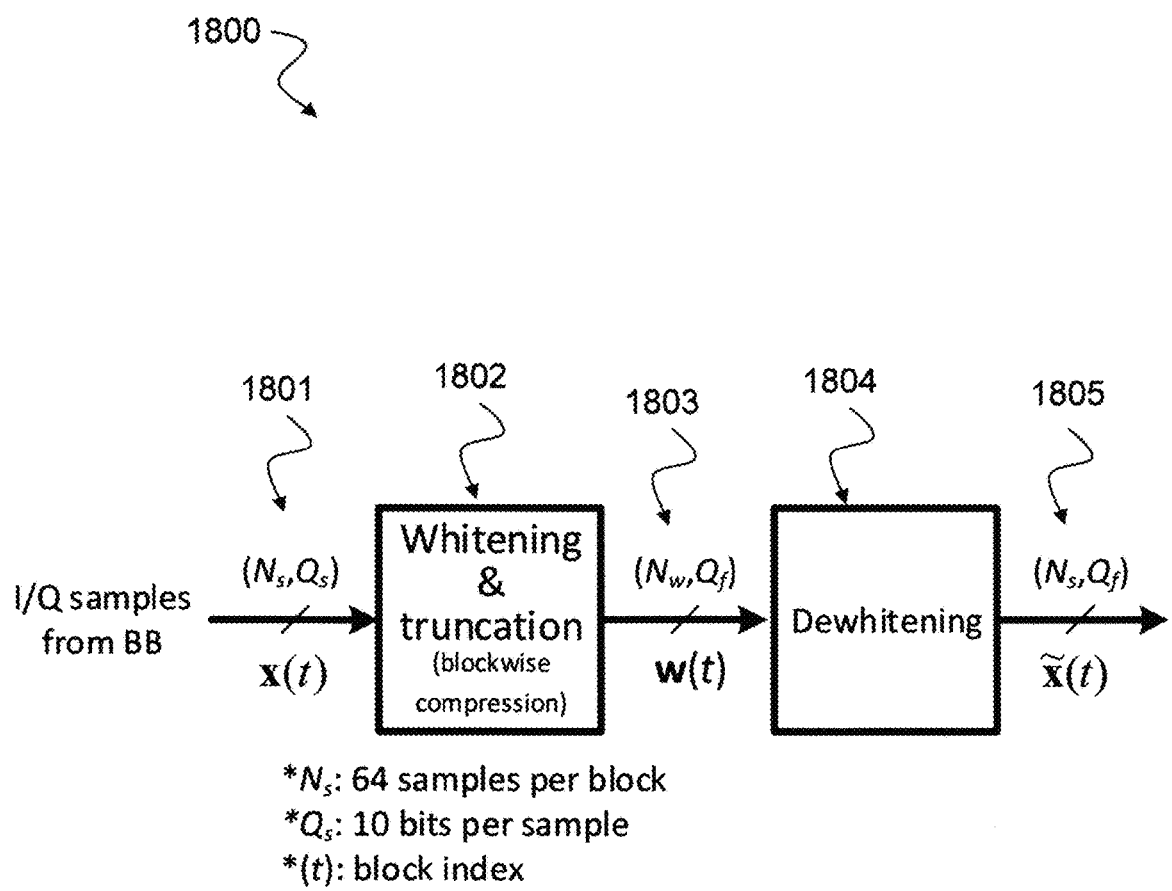
FIG. 18 is an exemplary block diagram of a symbol-wise compression method 1800 according to the disclosure.

FIG. 18 is a block diagram of a symbol-wise compression method 1800 according to the disclosure. I/Q samples 1801 are received from BB. The I/Q samples are passed to a whitening and truncation processing block 1802 for block-wise compression. Outputs 1803 of this block 1802 are passed to a de-whitening block 1804 which generates compressed data 1805.

In addition to the above bit-wise compression, a complementary symbol-wise compression method is presented in the following. First, we consider the time-domain correlation model of the IQ sample block (vector) 1801 denoted by $x(t) \in C^{N_s}$, where $N_s$ is the number of samples per block. As mentioned earlier, the samples are correlated with each other over a certain time window due to the actual bandwidth utilization of user data and oversampling. To capture this time-domain correlation, we model the IQ sample block such that $x \sim CN(0,R)$, where R is the covariance matrix such that $R = E[x(t)x(t)^H]$. In practice, one computes the sample covariance matrix $$\bar{R} = \frac{1}{T}\sum_{t=1}^{T} x(t)x(t)^H$$

to obtain R. The symbol block can be represented as $x(t) = R^{1/2} x_w(t)$, where $x_w(t) \sim CN(0,I)$. Due to the correlation among samples, the covariance matrix may be $R \neq I$, implying that $x(t)$ is a colored Gaussian process. Moreover, R could be rank deficient such that the number of non-negligible eigenvalues (also referred to as effective rank) denoted by $N_w$ is less than $N_s$. As a result, the disclosed method may exploit the redundancy in a colored Gaussian random vector in the following way. FIG. 18 shows the block diagram of the symbol-wise compression method, where $Q_s$ is the number of bits per original sample and $Q_f$ is the number of bits per compressed sample.

The whitening and truncation processing block 1802 performs whitening and truncation as described in the following. Whitening (also known as Karhunen-Loeve Transform (KLT)) is an operation that converts a colored (correlated) Gaussian process to its white Gaussian one. The eigen-decomposition of R gives a rise to $R = UDU^H$. We can then express the sample vector as $x(t) = U\tilde{x}_w(t)$, where $\tilde{x}_w(t) \sim CN(0,D)$ with D being the diagonal matrix of eigenvalues is the uncorrelated Gaussian process. Thus, multiplying $x(t)$ by $U^H$, we get $\tilde{x}_w(t)$.

For truncation it is assumed that R only has $N_w$ non-negligible eigenvalues, so the uncorrelated sample vector $\tilde{x}_w(t)$ can be truncated by a factor of $N_w/N_s$. The truncated sample vector is simply given by $w(t) = U(:,1:N_w)^H x(t) \in C^{N_w}$. Therefore, the whitening and truncation matrix is $U(:,1:N_w)^H$.

The de-whitening block 1804 performs the following. After receiving the above compressed sample vector through IO interface, the decompression module (or circuitry) de-whitens it to recover the original sample vector. This is done by multiplying $w(t)$ by the de-whitening matrix $U(:,1:N_w)$. For example, consider Ns=3. If $$D = \begin{bmatrix} d_1 & 0 & 0 \\ 0 & d_2 & 0 \\ 0 & 0 & 0 \end{bmatrix},$$

then $R = U(:,1:2)\text{diag}(d_1, d_2)U(:,1:2)^H$.

Applying whitening and truncation, the compression module (or circuitry) 1900a has the compressed sample vector $w(t) = U(:,1:2)^H x(t) \in C^2$, which is statistically equivalent (i.e., no loss of information or lossless) to $x(t) \in C^3$.

At the decompression module (or circuitry), we have $U(:,1:2)w(t)=U(:,1:2)U(:,1:2)U(:,1:2)\text{diag}(\sqrt{d_1}, \sqrt{d_2})U(:,1:2)^H x_w(t)=x(t)$ where we used $U(:,1:2)^H U(:,1:2)=I$. Hence, we can perfectly recover the original signal in this example. However, in realistic scenarios the covariance matrix R has generally not zero, but negligible eigenvalues so that the truncation operation incurs some marginal loss. Therefore, determining the reduced number $N_w$ of samples per block is a design parameter of the disclosed symbol-wise compression method, depending on the correlation level within the data block.

In the following, a low-complexity implementation of the compression is described. The number $N_w$ of compressed samples per block depends mainly on the ratio of the occupied bandwidth of the user data and the system bandwidth. This is also the case with the whitening and de-whitening matrices. As a result, with the information of the above ratio coming from the digital baseband processor, we can predefine a set of the whitening and de-whitening matrices depending on the ratio. With such a control information from the baseband, this allows us not to compute the covariance matrix on the fly any more. We just need to store the predefined set of whitening and de-whitening matrices at the compression module (or circuitry).

For computationally more efficient implementation of the above compression, we can consider the use of Look-Up Table (LUT). This allows us to avoid matrix multiplications at the sacrifice of memory size to store the LUTs. Although the above derivation is based on complex-valued operations, we can do the same thing by separately processing I and Q samples because they are independent of each other.

FIG. 19a is a block diagram of a hybrid compression method 1900a for time-domain compression according to the disclosure. The hybrid compression method 1900a combines the above-described bit-wise and symbol-wise compression methods.

I/Q samples 1901 are received from BB. The I/Q samples are passed to a whitening and truncation processing block 1902 for symbol-level compression. Outputs 1903 of this block 1902 are passed to a bit-level compression block 1904 which generates compressed data 1905.

The bit-wise and symbol-wise compression methods are independent of each other. While the symbol-wise operation reduces the number of symbols (samples) per block, the bit-wise reduces the number of bits per sample. Therefore, the hybrid method can provide a superior compression efficiency over either of separate methods, while keeping the distortion due to compression as small as possible.

FIG. 19b is a block diagram of a hybrid de-compression method 1900b according to the disclosure. IO links 1911 are passed to a bit-level decompression block 1912 which performs bit-level decompression, e.g. as described above with respect to the description of bit-level decompression. Outputs 1913 of this block 1912 are passed to a de-whitening processing block 1914 which de-whitens the outputs 1913 to obtain decompressed data 1915 which may be transported to DAC.

Figure 20:
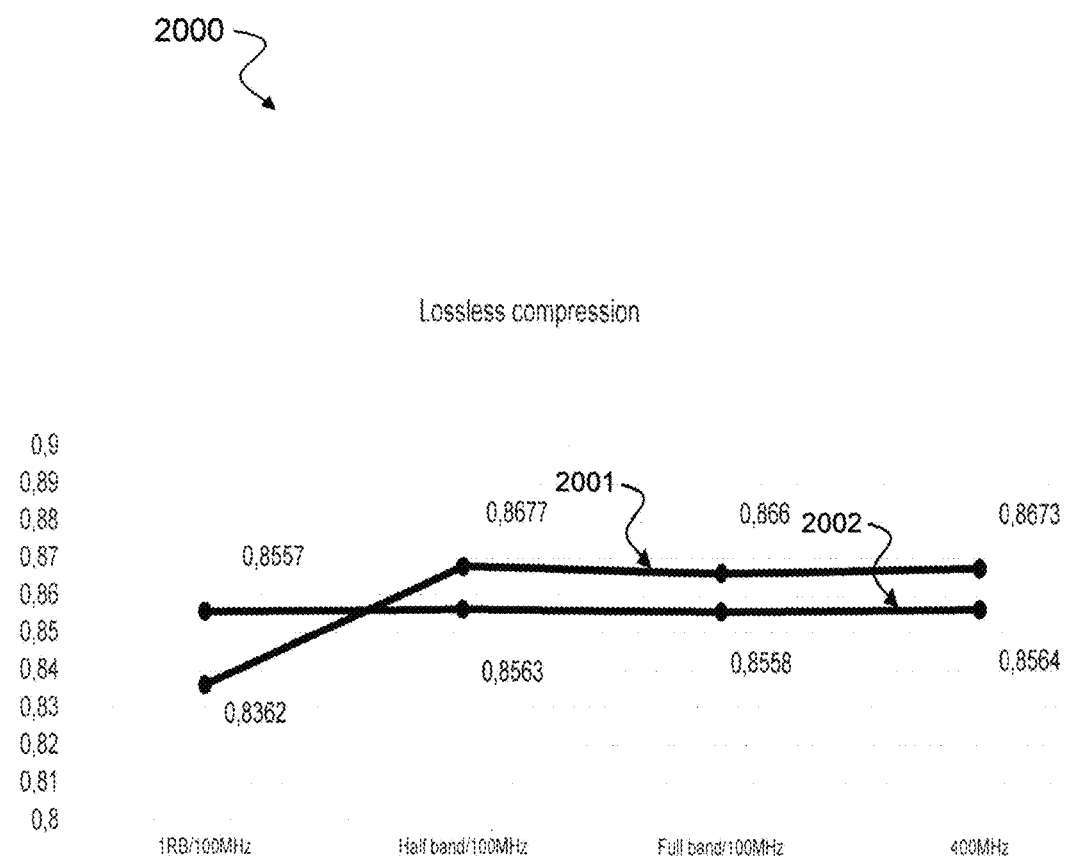
FIG. 20 is an exemplary performance diagram 2000 illustrating performance of lossless compression.

FIG. 20 is a performance diagram 2000 illustrating performance of lossless compression. FIG. 20 shows that performance of disclosed lossless data compression 2001 may perform better than theoretical optimal 2002, because theoretical optimization assumes data is independent while actual data is time correlated when bandwidth utilization is low. The disclosed algorithm processes data with small blocks which takes advantage from time correlation.

FIG. 20 shows performance results for the disclosed compression method 2001 using 5G mmWave uplink data set. Various bandwidth utilizations and system bandwidths are considered: 1 resource block (RB) over 100 MHz channel (1 RB/100 MHz), half band over 100 MHz channel (half band/100 MHz), full band over 100 MHz channel (full band/100 MHz), and full band over 400 MHz channel (full band/400 MHz). The set is quantized to 10 bits per I/Q samples.

We first consider bitwise lossless compression and compare the results with theoretical Huffman coding. Huffman coding achieves theoretical maximum compression ratio when data is independent and identical distributed (i.i.d.). The Huffman coding achieves $$H(x) \leq l < H(x)+1$$

where $H(x)$ is entropy of data, and $l$ is compression ratio. As shown in FIG. 20, the disclosed algorithm can compress data 14% for half and full band utilized channels. It has only 1% compression gap from theoretical optimal. However, it outperforms Huffman coding for 1 RB case because when bandwidth utilization is low, data becomes time correlated. Since we process data in blocks, the disclosed algorithm can compress signal more efficiently.

Figure 21:
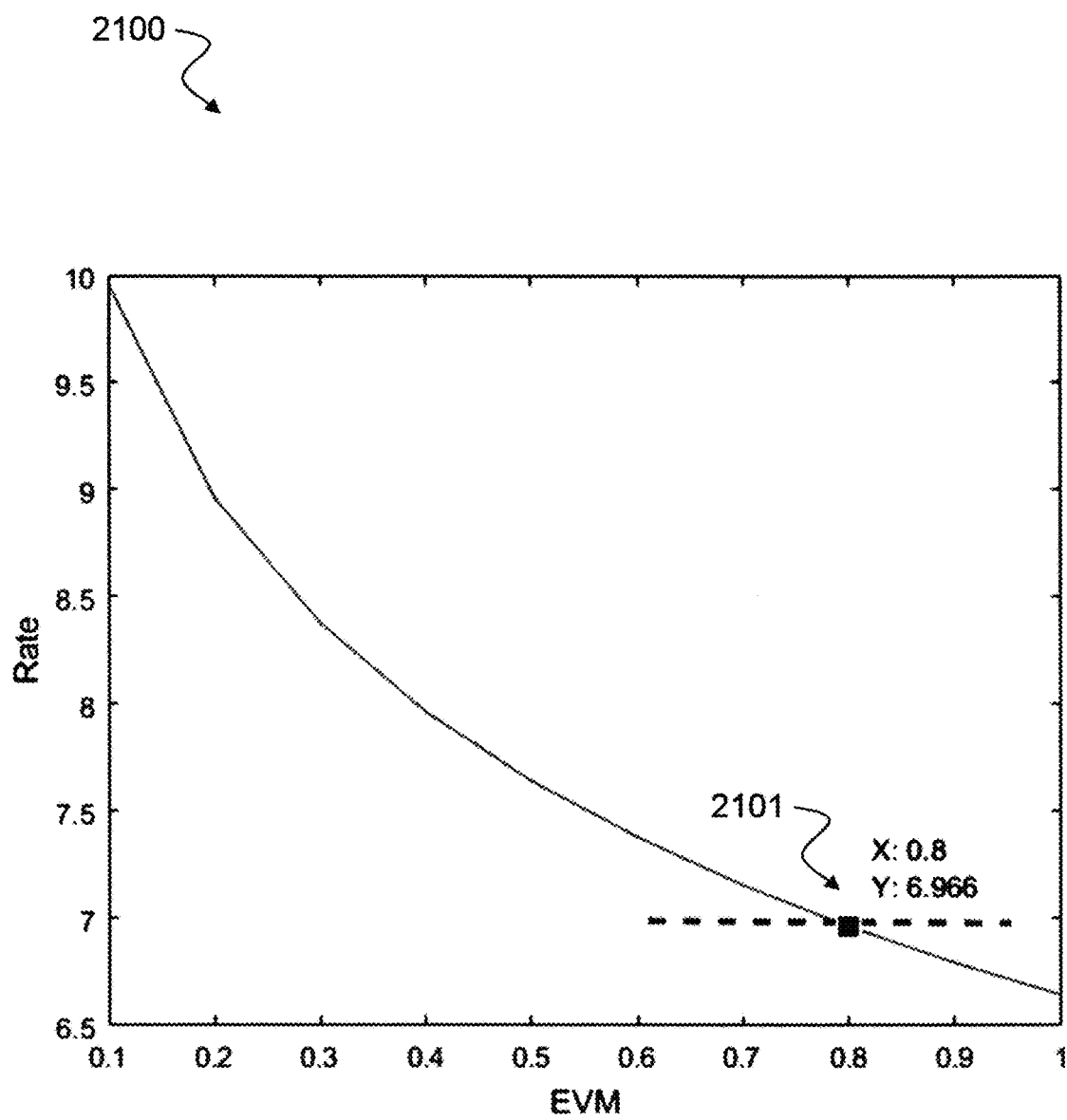
FIG. 21 is an exemplary EVM diagram 2100 illustrating theoretical upper bound on rate for given EVM performance for Gaussian inputs.

FIG. 21 is an EVM diagram 2100 illustrating theoretical upper bound on rate for given EVM performance for Gaussian inputs.

FIG. 21 illustrates performance results for low complexity lossy compression. In this case, we compare the presented performance with rate-distortion theory. Rate distortion theory provides an upper bound on the compression rate for Gaussian input. According to rate-distortion theory $$R(D) = \begin{cases} \frac{1}{2}\log_2 \frac{\sigma^2}{D}, & \ldots, D < \sigma^2 \\ 0, & D > \sigma^2 \end{cases}$$

where distortion $D=E\{(x-y)^2\}$, $\sigma^2$ is variance of input, and R is rate in terms of bits. Then, rate-EVM curve can be obtained as in FIG. 21.

Figure 22A:
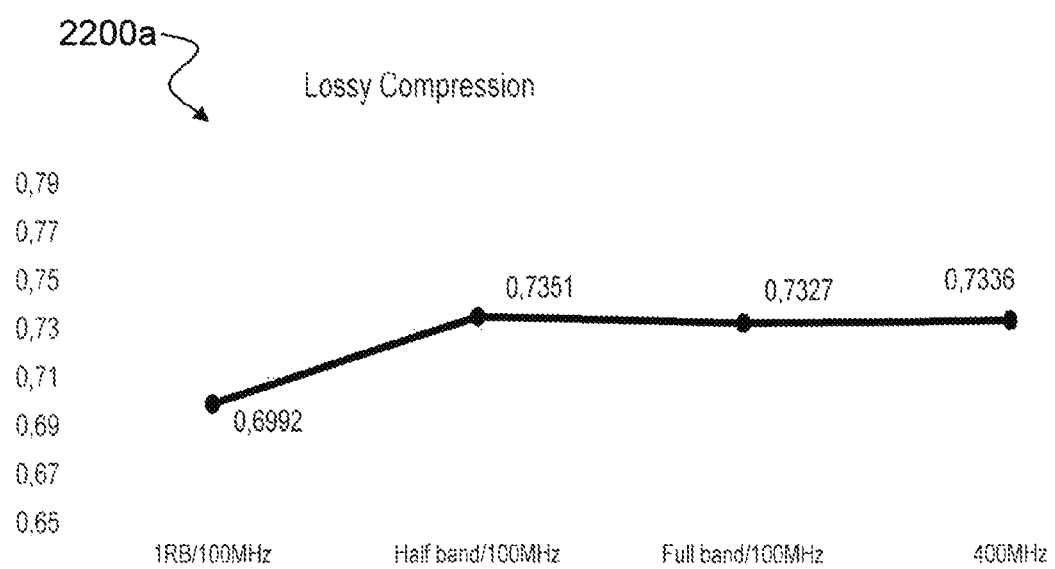
FIG. 22a is a performance diagram 2200a illustrating an exemplary compression ratio of low complexity lossy data compression.
Figure 22B:
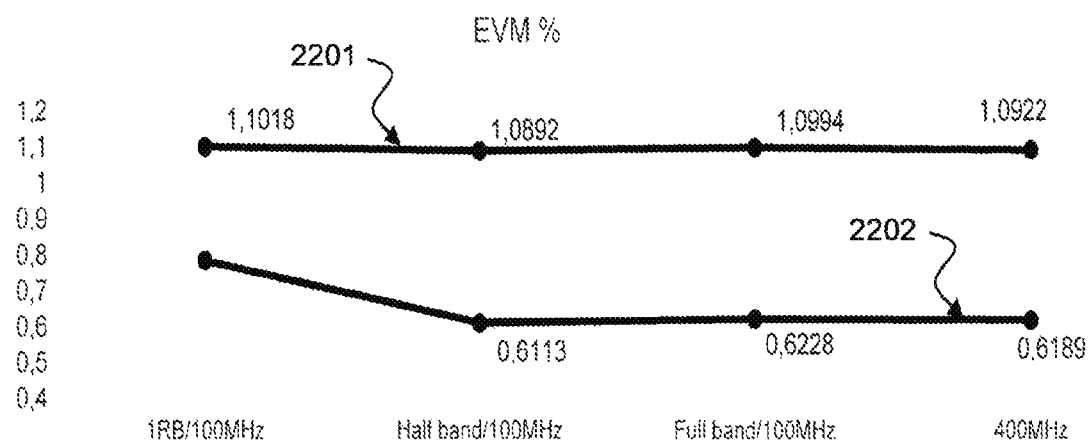
FIG. 22b is a performance diagram 2200b illustrating an exemplary EVM performance of low complexity lossy data compression.

FIG. 22 includes performance diagrams 2200a, 2200b illustrating compression ratio (see FIG. 22a) and EVM performance (see FIG. 22b) of low complexity lossy data compression.

As shown in FIG. 22b, the disclosed algorithm 2201 has only 0.48% EVM gap from optimal achievable EVM 2202. Here, theory assumes compression over a data of infinite size whereas in the disclosed method 2201 we consider latency requirement and do procession per block.

Next, we provide performance of temporal compression via whitening and de-whitening. As shown in Table 2, depending on bandwidth utilization the disclosed temporal compression provides 85% to 61% compression for only ~0.2% EVM.

TABLE 2 performance of temporal compression.

| I/Q samples | EVM (%) | Compression rate ($N_w/N_s$) |
|---|---|---|
| 400 Mhz | 0.21 | 0.84 (54/64) |
| 100 Mhz | 0.23 | 0.84 (54/64) |
| 100 Mhz half | 0.27 | 0.84 (54/64) |

TABLE 2-continued performance of temporal compression.

| I/Q samples | EVM (%) | Compression rate ($N_w/N_s$) |
|---|---|---|
| 100 Mhz 1RB | 0.24 | 0.61 (39/64) |

Figure 23A:
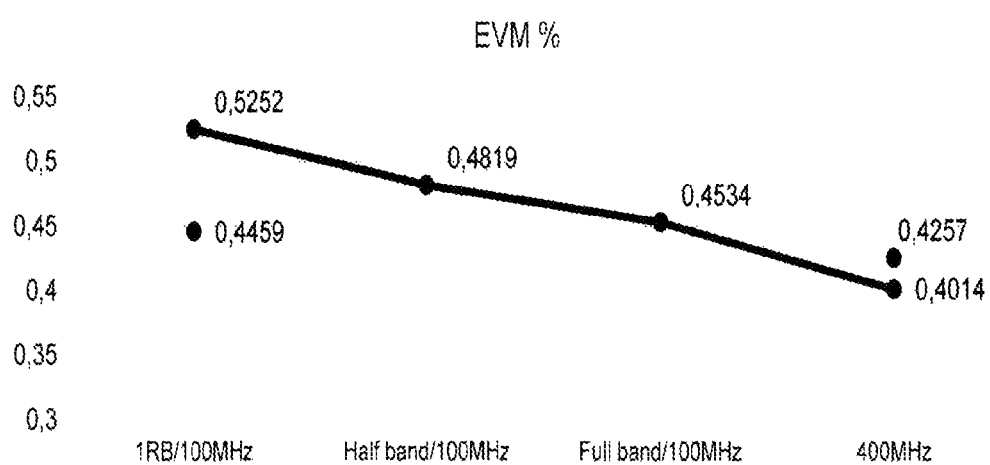
FIG. 23a is a performance diagram 2300a illustrating an exemplary EVM performance of combined temporal and bitwise data compression.
Figure 23B:
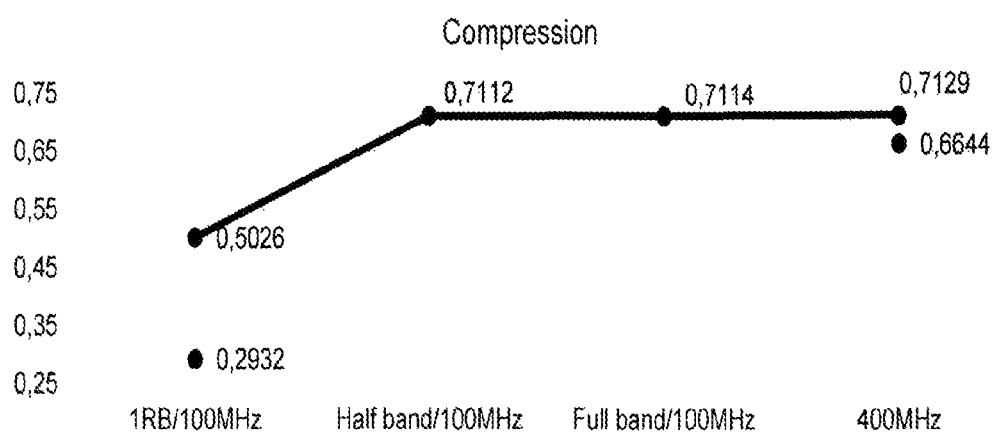
FIG. 23b is an exemplary performance diagram 2300b illustrating of combined temporal and bitwise data compression.

FIG. 23 are performance diagrams 2300a, 2300b illustrating EVM performance (FIG. 23a) and compression (FIG. 23b) of combined temporal and bitwise data compression.

As shown in the figure, we can easily achieve ~70% compression with only 0.5% EVM degradation. Note that for 256QAM, EVM requirement is maximum 1.5% which is much higher than what we can obtain. In the figure, the isolated points show that we can further optimize bitwise algorithm according to scenario to get better EVM and compression ratio. We can also design universal algorithm for all scenarios in which case, we obtain performances linked by a line in the figure.

Figure 24:
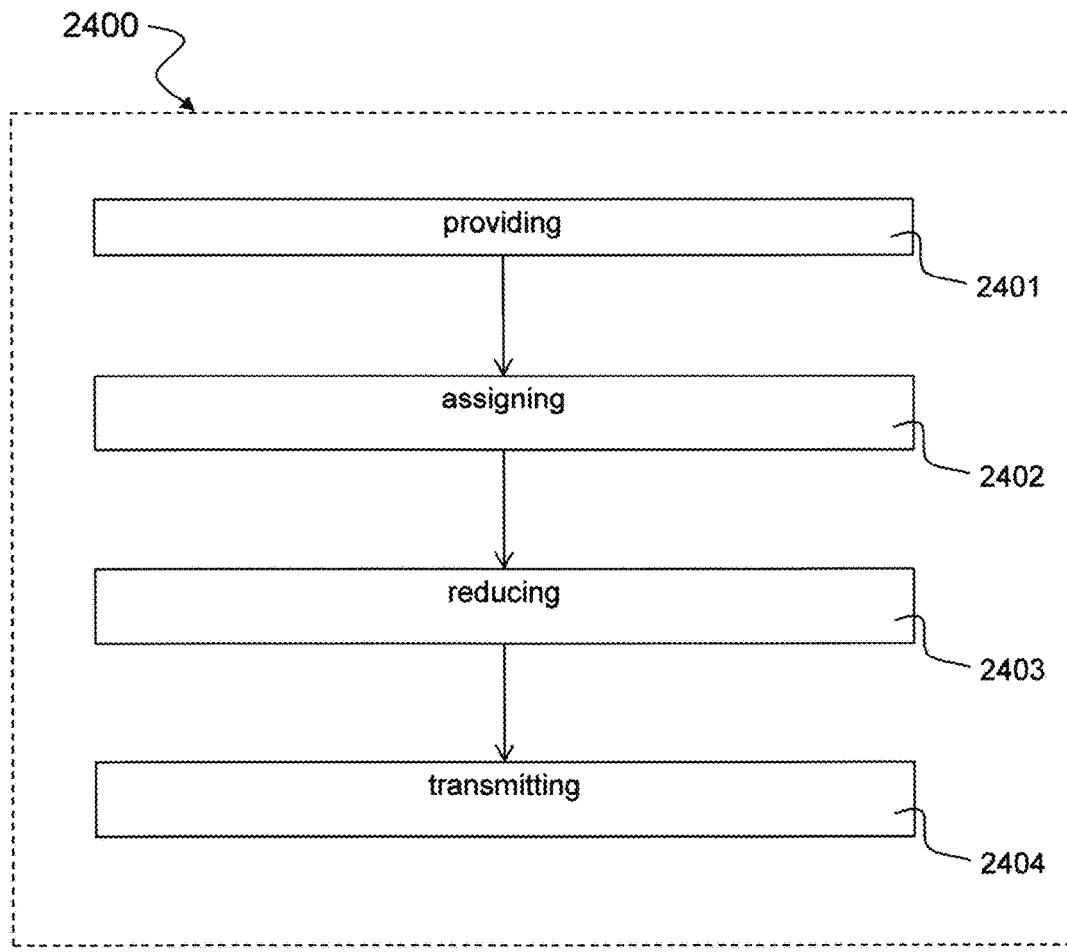
FIG. 24 is a schematic diagram illustrating an exemplary method 2400 for bitwise compressed transmission of a plurality of data blocks according to the disclosure.

FIG. 24 is a schematic diagram illustrating a method 2400 for bitwise compressed transmission of a plurality of data blocks according to the disclosure.

The method 2400 for bitwise-compressed transmission of a plurality of data blocks, wherein each data block comprises a plurality of data values of a known data distribution, comprises the following blocks: providing 2401 for each data block a plurality of regions indexed by respective region tags, wherein each region represents a specific range of data values of the data block; assigning 2402 each data value of the data block to a respective region of the plurality of regions based on a size of the data value; reducing 2403 a number of bits of the data value based on a size of the region to which the data value is assigned to; and transmitting 2404 the data values of the plurality of data blocks based on the reduced number of bits of the data values and their corresponding region tags, e.g. as described above with respect to FIGS. 13 to 15.

The method 2400 may further comprise: applying the reduction of the number of bits to an absolute value of the data value, e.g. as described above with respect to FIGS. 13 to 15.

The method 2400 may further comprise: appending a sign bit to the reduced number of bits of the data value, wherein the sign bit indicates a sign of the data value, e.g. as described above with respect to FIGS. 13 to 15.

The method 2400 may further comprise: appending a block tag to data values of a specific data block, wherein the block tag indicates the specific data block, e.g. as described above with respect to FIGS. 13 to 15.

The block tag may indicate a total number of regions applied to the specific data block. The block tag may indicate a bit-width of the regions of the specific data block. At least two regions of the plurality of regions may comprise different bit-widths, e.g. as described above with respect to FIGS. 13 to 15.

The region tags may be obtained based on Huffman coding. The size of the region to which the data value is assigned to be fixed or adaptive, e.g. as described above with respect to FIGS. 13 to 15.

The method 2400 may further comprise: truncating the reduced number of bits of the data values to a predefined number of bits, e.g. as described above with respect to FIGS. 13 to 15.

The method 2400 may further comprise: block scaling the reduced number of bits of the data values and quantizing the block-scaled reduced number of bits to a predefined number of bits, e.g. as described above with respect to FIGS. 13 to 15.

The method 2400 may further comprise: transmitting the data values of the plurality of data blocks via a digital interface between a digital front end (DFE) and a baseband (BB) circuitry of a data processing device, e.g. as described above with respect to FIGS. 13 to 15.

The method 2400 may further comprise: transmitting the data values of the plurality of data blocks via a digital interface between a mmWave RF front-end and a BB processor, e.g. as described above with respect to FIGS. 13 to 15.

The method 2400 may further comprise: decompressing the plurality of data blocks based on the transmitted data values of the plurality of data blocks and their corresponding region tags, e.g. as described above with respect to FIGS. 13 to 15.

Figure 25:
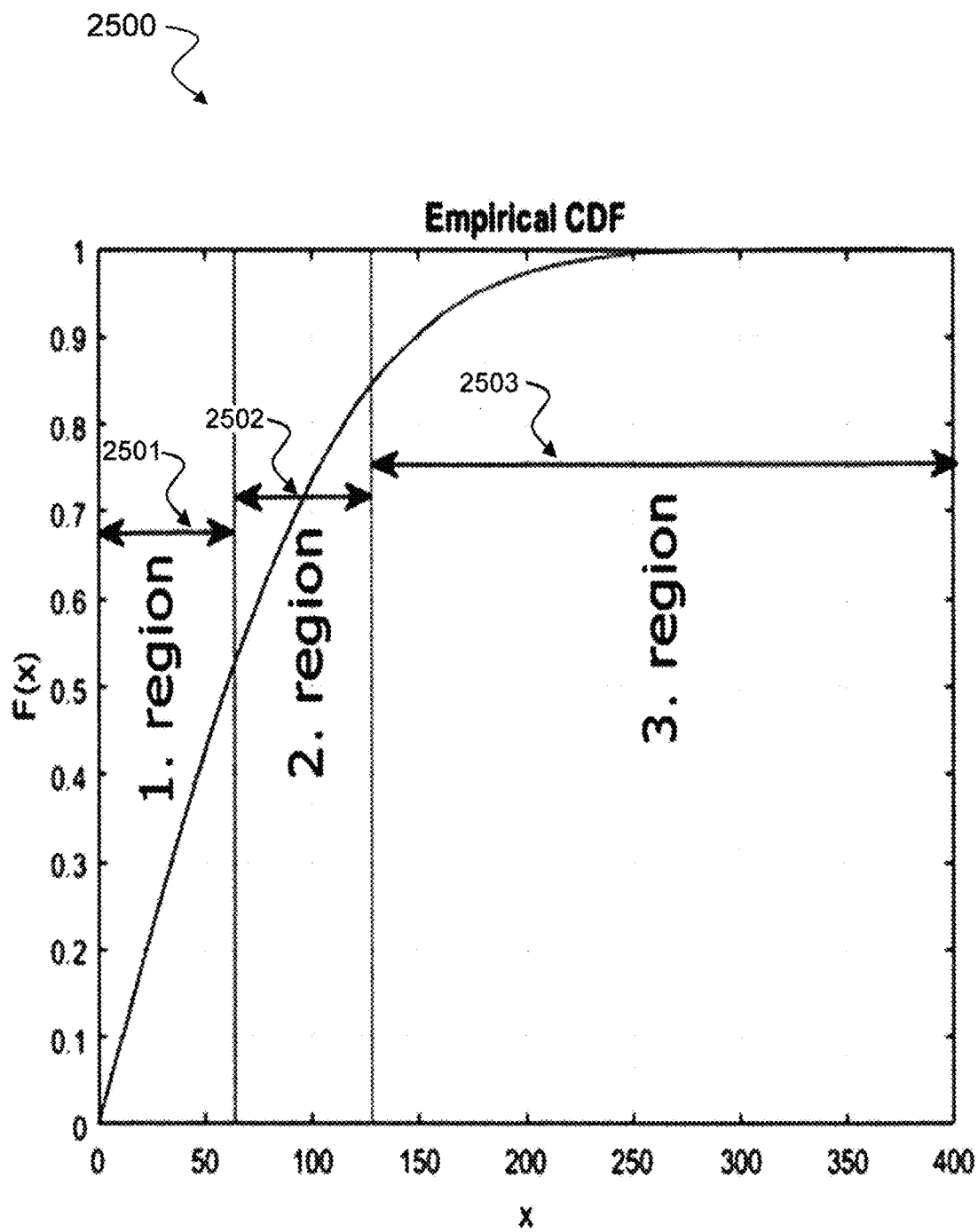
FIG. 25 is a diagram illustrating an exemplary empirical cumulative distribution function (CDF) 2500 for a lossless bitwise compression technique according to the disclosure.

FIG. 25 is a diagram illustrating an exemplary empirical cumulative distribution function (CDF) 2500 for a lossless bitwise compression technique according to the disclosure.

The empirical CDF may be divided in an exemplary number of three regions 2501, 2502, 2503. Data values between 0 and about 65 may be assigned to the first region 2501 and correspondingly compressed. Data values between about 65 and about 130 may be assigned to the second region 2502 and correspondingly compressed. Data values between about 130 and 400 or greater may be assigned to the third region 2503 and correspondingly compressed.

Figure 26:
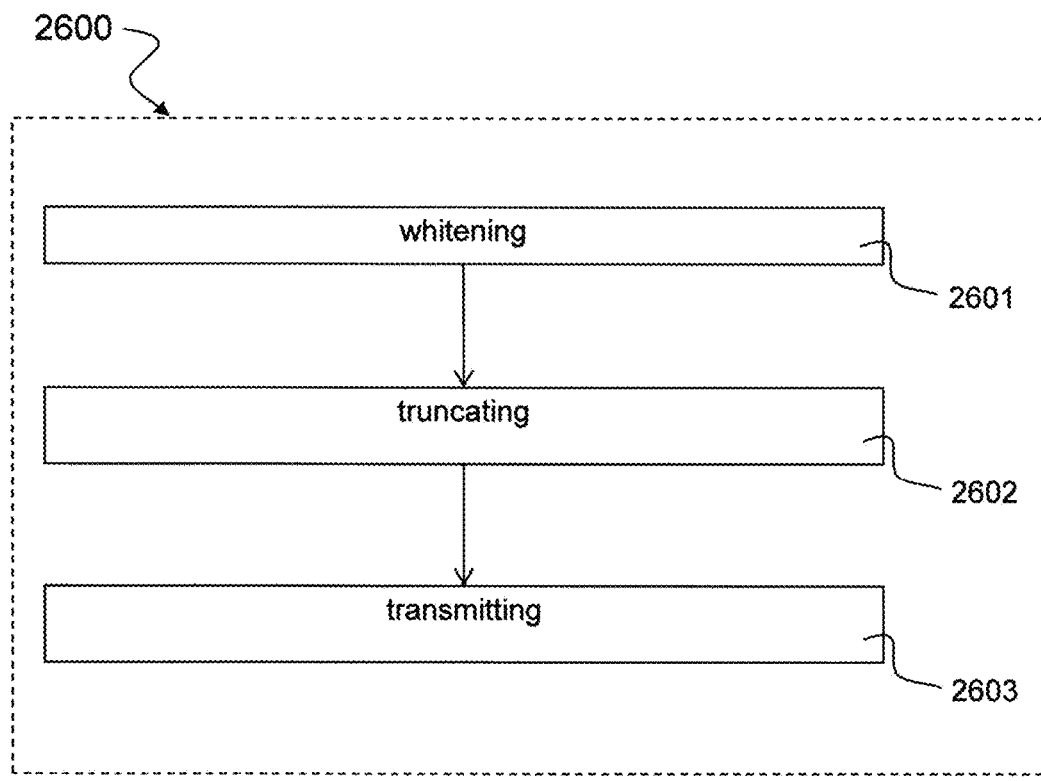
FIG. 26 is a schematic diagram illustrating an exemplary method 2600 for block-wise compressed transmission of a plurality of data blocks according to the disclosure.

FIG. 26 is a schematic diagram illustrating a method 2600 for block-wise compressed transmission of a plurality of data blocks according to the disclosure. Each data block comprises a plurality of data samples of a known data distribution.

The method 2600 comprises: whitening 2601 each data block based on a whitening matrix which is based on an eigenvalue decomposition applied to a sample covariance matrix of data samples of the respective data block, e.g. as described above with respect to FIG. 18; truncating 2602 the whitened data blocks based on a number of eigenvalues of the sample covariance matrix, wherein the eigenvalues are greater than a threshold, e.g. as described above with respect to FIG. 18; and transmitting 2603 the whitened and truncated data blocks, e.g. as described above with respect to FIG. 18.

The method 2600 may further comprise: whitening each data block based on a predefined set of whitening matrices, e.g. as described above with respect to FIG. 18.

The predefined set of whitening matrices may be based on a ratio of user data bandwidth and system bandwidth. The method 2600 may further comprise: de-whitening the transmitted data blocks based on a de-whitening matrix which corresponds to an inverse of the whitening matrix, e.g. as described above with respect to FIG. 18. The data samples of a respective data block may be correlated with each other over a predetermined time window.

Figure 27:
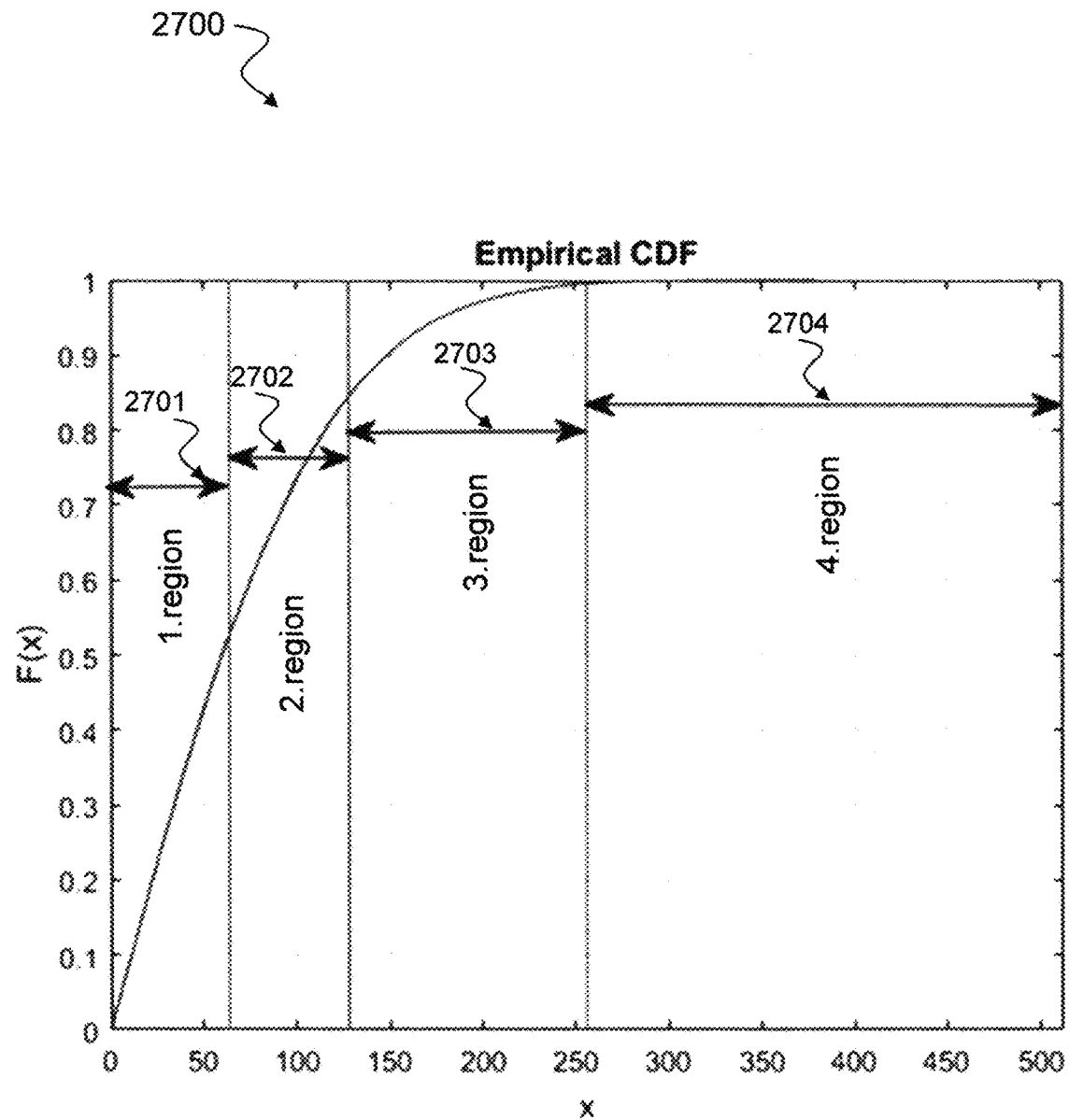
FIG. 27 is a diagram illustrating an exemplary empirical cumulative distribution function (CDF) 2700 for a low complexity lossy compression technique according to the disclosure.

FIG. 27 is a diagram illustrating an exemplary empirical cumulative distribution function (CDF) 2700 for a low complexity lossy compression technique according to the disclosure.

The empirical CDF may be divided in an exemplary number of four regions 2701, 2702, 2703, 2704. Data values between 0 and about 65 may be assigned to the first region 2701 and correspondingly compressed. Data values between about 65 and about 130 may be assigned to the second region 2702 and correspondingly compressed. Data values between about 130 and about 255 may be assigned to the third region 2703 and correspondingly compressed. Data values greater than about 255 may be assigned to the fourth region 2704 and correspondingly compressed.

The devices and systems described in this disclosure may be implemented as Digital Signal Processors (DSP), microcontrollers or any other side-processor or hardware circuit on a chip or an application specific integrated circuit (ASIC).

Embodiments described in this disclosure can be implemented in digital electronic circuitry, or in computer hardware, firmware, software, or in combinations thereof, e.g. in available hardware of mobile devices or in new hardware dedicated for processing the methods described herein.

The present disclosure also supports a computer program product including computer executable code or computer executable instructions that, when executed, causes at least one computer to execute the performing and computing blocks described herein, in particular the methods described above with respect to FIGS. 12, 24 and 26 and the computing blocks described above with respect to FIGS. 2 and 3. Such a computer program product may include a non-transient readable storage medium storing program code thereon for use by a processor, the program code comprising instructions for performing the methods or the computing blocks as described above.

EXAMPLES

The following examples pertain to further embodiments. Example 1 is a data processing device, comprising: a digital front end (DFE) configured to convert an antenna signal to digital data, the digital data comprising a plurality of data symbols; a baseband (BB) circuitry configured to process the digital data in baseband; and a digital interface between the DFE and the BB circuitry, wherein the DFE comprises a data compression circuitry configured to compress the plurality of data symbols for use in transmission via the digital interface to the BB circuitry.

In Example 2, the subject matter of Example 1 can optionally include that the data compression circuitry comprises a Fast Fourier Transform (FFT) circuitry configured to perform a compression of the plurality of data symbols.

In Example 3, the subject matter of any one of Examples 1-2 can optionally include that the plurality of data symbols comprises a plurality of Orthogonal Frequency Division Multiplex (OFDM) symbols.

In Example 4, the subject matter of any one of Examples 1-2 can optionally include that the digital interface is configured to transmit frequency domain samples of the plurality of data symbols between the DFE and the BB circuitry.

In Example 5, the subject matter of any one of Examples 1-2 can optionally include that the data compression circuitry is configured to compress the plurality of data symbols based on a removal of at least one of a cyclic prefix and an unused subcarrier.

In Example 6, the subject matter of Example 2 can optionally include that the data compression circuitry is configured to compress the plurality of data symbols based on using different word lengths for inband FFT samples and out-of-band FFT samples.

In Example 7, the subject matter of any one of Examples 1-2 can optionally include that the data compression circuitry is configured to compress the plurality of data symbols based on lossless compression when the data compression circuitry is operated in a lossless compressor mode.

In Example 8, the subject matter of Example 7 can optionally include that the data compression circuitry is configured to compress the plurality of data symbols into OFDM symbol-aligned frequency domain samples when the data compression circuitry is operated in the lossless compressor mode.

In Example 9, the subject matter of Example 8 can optionally include that a symbol boundary position of the OFDM symbol-aligned frequency domain samples is known when the data compression circuitry is operated in the lossless compressor mode.

In Example 10, the subject matter of any one of Examples 1-2 can optionally include that the data compression circuitry is configured to compress the plurality of data symbols based on lossy compression when the data compression circuitry is operated in a lossy compressor mode.

In Example 11, the subject matter of Example 10 can optionally include that the data compression circuitry is configured to compress the plurality of data symbols into non-OFDM symbol-aligned frequency domain samples when the data compression circuitry is operated in the lossy compressor mode.

In Example 12, the subject matter of any one of Examples 1-2 can optionally include a control loop arranged between the BB circuitry and the DFE, wherein the control loop is configured to time-align the compressed data symbols with non-compressed data symbols.

In Example 13, the subject matter of Example 12 can optionally include that the control loop is configured to time-align the compressed data symbols in lossless compressor mode with the compressed data symbols in lossy compressor mode.

In Example 14, the subject matter of any one of Examples 1-2 can optionally include that the DFE is configured to transceive a millimeter wave antenna signal.

Example 15 is a method for transmitting data symbols between a digital front end (DFE) and a baseband (BB) circuitry, the method comprising: converting an antenna signal to digital data by the DFE, wherein the digital data comprises a plurality of data symbols; transmitting the plurality of data symbols from the DFE to the BB circuitry by a digital interface arranged between the DFE and the BB circuitry; and compressing the plurality of data symbols for use in transmission via the digital interface.

In Example 16, the subject matter of Example 15 can optionally include: performing the compression of the plurality of data symbols based on a Fast Fourier Transform (FFT).

In Example 17, the subject matter of any one of Examples 15-16 can optionally include that the plurality of data symbols comprises a plurality of Orthogonal Frequency Division Multiplex (OFDM) symbols.

In Example 18, the subject matter of any one of Examples 15-16 can optionally include: transmitting frequency domain samples of the plurality of data symbols via the digital interface.

In Example 19, the subject matter of any one of Examples 15-16 can optionally include: compressing the plurality of data symbols based on a removal of at least one of a cyclic prefix and an unused subcarrier.

In Example 20, the subject matter of Example 16 can optionally include: compressing the plurality of data symbols based on using different word lengths for inband FFT samples and out-of-band FFT samples.

Example 21 is a device for transmitting data symbols between a digital front end (DFE) and a baseband (BB) circuitry, the device comprising: means for converting an antenna signal to digital data, wherein the digital data comprises a plurality of data symbols; means for transmitting the plurality of data symbols from the DFE to the BB circuitry via a digital interface arranged between the DFE and the BB circuitry; and means for compressing the plurality of data symbols for use in transmission via the digital interface.

In Example 22, the subject matter of Example 21 can optionally include: means for performing a compression of the plurality of data symbols based on a Fast Fourier Transform (FFT).

Example 23 is a method for a bitwise-compressed transmission of a plurality of data blocks, wherein each data block comprises a plurality of data values of a known data distribution, the method comprising: providing for each data block a plurality of regions indexed by respective region tags, wherein each region represents a specific range of data values of the data block; assigning each data value of the data block to a respective region of the plurality of regions based on a size of the data value; reducing a number of bits of the data value based on a size of the region to which the data value is assigned to; and transmitting the data values of the plurality of data blocks based on the reduced number of bits of the data values and their corresponding region tags.

In Example 24, the subject matter of Example 23 can optionally include: applying the reduction of the number of bits to an absolute value of the data value.

In Example 25, the subject matter of any one of Examples 23-24 can optionally include: appending a sign bit to the reduced number of bits of the data value, wherein the sign bit indicates a sign of the data value.

In Example 26, the subject matter of any one of Examples 23-24 can optionally include: appending a block tag to data values of a specific data block, wherein the block tag indicates the specific data block.

In Example 27, the subject matter of Example 26 can optionally include that the block tag indicates a total number of regions applied to the specific data block.

In Example 28, the subject matter of Example 27 can optionally include that the block tag indicates a bit-width of the regions of the specific data block.

In Example 29, the subject matter of any one of Examples 23-24 can optionally include that at least two regions of the plurality of regions comprise different bit-widths.

In Example 30, the subject matter of any one of Examples 23-24 can optionally include that the region tags are obtained based on a Huffman coding.

In Example 31, the subject matter of any one of Examples 23-24 can optionally include that the size of the region to which the data value is assigned to is adaptive.

In Example 32, the subject matter of any one of Examples 23-24 can optionally include: truncating the reduced number of bits of the data values to a predefined number of bits.

In Example 33, the subject matter of any one of Examples 23-24 can optionally include: block scaling the reduced number of bits of the data values; and quantizing the block-scaled reduced number of bits to a predefined number of bits.

In Example 34, the subject matter of any one of Examples 23-24 can optionally include: transmitting the data values of the plurality of data blocks via a digital interface between a digital front end (DFE) and a baseband (BB) circuitry of a data processing device.

In Example 35, the subject matter of any one of Examples 23-24 can optionally include: transmitting the data values of the plurality of data blocks via a digital interface between a mmWave RF front end and a BB processor.

In Example 36, the subject matter of any one of Examples 23-24 can optionally include: decompressing the plurality of data blocks based on the transmitted data values of the plurality of data blocks and their corresponding region tags.

Example 37 is a method for block-wise compressed transmission of a plurality of data blocks, wherein each data block comprises a plurality of data samples of a known data distribution, the method comprising: whitening each data block based on a whitening matrix, wherein the whitening matrix is based on an eigenvalue decomposition applied to a sample covariance matrix of data samples of the respective data block; truncating the whitened data blocks based on a number of eigenvalues of the sample covariance matrix, wherein the eigenvalues are greater than a threshold value; and transmitting the whitened and truncated data blocks.

In Example 38, the subject matter of Example 37 can optionally include: whitening each data block based on a predefined set of whitening matrices.

In Example 39, the subject matter of Example 38 can optionally include that the predefined set of whitening matrices is based on a ratio of a user data bandwidth and a system bandwidth.

In Example 40, the subject matter of any one of Examples 37-38 can optionally include: de-whitening the transmitted data blocks based on a de-whitening matrix, wherein the de-whitening matrix corresponds to an inverse of the whitening matrix.

In Example 41, the subject matter of any one of Examples 37-38 can optionally include that the data samples of a respective data block are correlated with each other over a predetermined time window.

Example 42 is a method for hybrid-compressed transmission of a plurality of data blocks, wherein each data block comprises a plurality of data samples of a known data distribution, the method comprising: whitening each data block based on a whitening matrix, wherein the whitening matrix is based on an eigenvalue decomposition applied to a sample covariance matrix of data samples of the respective data block; truncating the whitened data blocks based on a number of eigenvalues of the sample covariance matrix, wherein the eigenvalues are greater than a threshold value; providing for each truncated and whitened data block a plurality of regions indexed by respective region tags, wherein each region represents a specific range of data values of the truncated and whitened data block; assigning each data value of the truncated and whitened data block to a respective region of the plurality of regions based on a size of the data value; reducing a number of bits of the data value based on a size of the region to which the data value is assigned to; and transmitting the data values of the plurality of truncated and whitened data blocks based on the reduced number of bits of the data values and their corresponding region tags.

In Example 43, the subject matter of Example 42 can optionally include: applying the reduction of the number of bits to an absolute value of the data value.

Example 44 is a computer readable non-transitory medium on which computer instructions are stored which when executed by a computer cause the computer to perform the method of any of Examples 15 to 20 or Examples 23 to 43.

Example 45 is a method of time domain compression and decompression with small block of data and low complexity algorithms for real time processing.

In Example 46, the subject matter of Example 45 can optionally include that the method is a low complexity lossless compression method.

In Example 47, the subject matter of Example 46 can optionally include that a compression algorithm is applied to absolute values of data.

In Example 48, the subject matter of Example 46 can optionally include that there are multiple regions for data values in which different bit-width is used.

In Example 49, the subject matter of Example 48 can optionally include that the maximum number of regions R are selected to increase compression ratio.

In Example 50, the subject matter of Example 46 can optionally include that a tag is appended at the beginning of data value to indicate the region of data value that it falls into.

In Example 51, the subject matter of Example 50 can optionally include that tag of the regions are obtained by Huffman coding using probability mass distribution function.

In Example 52, the subject matter of Example 46 can optionally include that data block size $N_s$ is determined to increase compression ratio.

In Example 53, the subject matter of Example 52 can optionally include that the maximum required number of regions within data block is computed.

In Example 54, the subject matter of Example 51 can optionally include that Huffman coding is applied for different number of regions.

In Example 55, the subject matter of Example 48 can optionally include that the maximum required number of regions are tagged at the beginning of data block.

In Example 56, the subject matter of Example 43 can optionally include that in each region either fixed bit width or adaptive bit-width is used.

In Example 57, the subject matter of Example 56 can optionally include that if adaptive bit-width is used for a region, in that region the maximum bit-width is computed.

In Example 58, the subject matter of Example 57 can optionally include that the maximum number of bits are tagged at the beginning of data block.

In Example 59, the subject matter of Example 43 can optionally include that the lower threshold $\Sigma_{j=1}^{r-1} 2^{l_j}$ is subtracted from each data value if data value is in region r.

In Example 60, the subject matter of Example 45 can optionally include that the method is a low complexity lossy data compression method.

In Example 61, the subject matter of Example 60 can optionally include that a compression algorithm is applied to absolute values of data.

In Example 62, the subject matter of Example 60 can optionally include that there are multiple regions for data values in which different bit-width is used.

In Example 63, the subject matter of Example 62 can optionally include that the maximum number of regions R are selected to reduce EVM and increase compression ratio.

In Example 64, the subject matter of Example 60 can optionally include that a tag is appended at the beginning of data value to indicate the region of data value that it falls into.

In Example 65, the subject matter of Example 60 can optionally include that tag of the regions are obtained by Huffman coding using probability mass distribution function.

In Example 66, the subject matter of Example 60 can optionally include that data block size $N_s$ is determined to reduce EVM and increase compression ratio.

In Example 67, the subject matter of Example 66 can optionally include that the maximum required number of regions within data block is computed.

In Example 68, the subject matter of Example 65 can optionally include that Huffman coding is applied for different number of regions.

In Example 69, the subject matter of Example 67 can optionally include that the maximum required number of regions are tagged at the beginning of data block.

In Example 70, the subject matter of Example 64 can optionally include that in each region either fixed bit width with truncation or block scaling is used.

In Example 71, the subject matter of Example 70 can optionally include that if block scaling is used for a region, in that region the maximum data value is obtained and tagged to the beginning of data block.

In Example 72, the subject matter of Example 64 can optionally include that the lower threshold $\Sigma_{j=1}^{r-1} 2^{l_j}$ is subtracted from each data value if data value is in region r.

In Example 73, the subject matter of Example 70 can optionally include that the bit truncation level is obtained to have minimum EVM and more compression ratio.

In Example 74, the subject matter of Example 60 or Example 46 can optionally include that block and data tags are known to compression and decompression algorithms.

Example 75 is a method of compressing IQ data by reducing the number of samples per data block through the compression matrix and restoring the original IQ data through the decompression matrix.

In Example 76, the subject matter of Example 75 can optionally include that the symbol-level compression matrix consists of the columns of the covariance matrix of the data block.

In Example 77, the subject matter of Example 75 can optionally include that the symbol-level compression matrix is given by only taking the columns corresponding to non-negligible eigenvalues of the covariance matrix and by truncating the rest of columns.

In Example 78, the subject matter of Example 75 can optionally include that the decompression matrix is given by the complex conjugate of the compression matrix.

In Example 79, the subject matter of Example 75 can optionally include that the compression is done by multiplying the data block by the compression matrix, and the decompression is done by multiplying the compressed data block by the decompression matrix.

In Example 80, the subject matter of Example 75 can optionally include that a set of the compression and decompression matrices are predetermined according to the ratio of signal bandwidth and system bandwidth to avoid the computation of those matrices.

In Example 81, the subject matter of Example 80 can optionally include that a control signal of the ratio from the baseband processer is given to the compression and decompression modules.

In Example 82, the subject matter of Example 75 can optionally include that LUTs can be used to avoid matrix multiplications during compression and decompression.

Example 83 is a method of combining bit-level lossy or lossless compression and symbol-level compression.

In addition, while a particular feature or aspect of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it is understood that aspects of the disclosure may be implemented in discrete circuits, partially integrated circuits or fully integrated circuits or programming means. Also, the terms "exemplary", "for Example" and "e.g." are merely meant as an Example, rather than the best or optimal.

Although specific aspects have been illustrated and described herein, it will be appreciated by those of ordinary skill in the art that a variety of alternate and/or equivalent implementations may be substituted for the specific aspects shown and described without departing from the scope of the present disclosure. This application is intended to cover any adaptations or variations of the specific aspects discussed herein.

Although the elements in the following claims are recited in a particular sequence with corresponding labeling, unless the claim recitations otherwise imply a particular sequence for implementing some or all of those elements, those elements are not necessarily intended to be limited to being implemented in that particular sequence.

The invention claimed is:

1. A data processing device, comprising:
a digital front end (DFE) circuitry configured to convert an antenna signal to digital data, wherein the digital data comprises a plurality of data symbols;
a baseband (BB) circuitry configured to process the digital data in baseband; and
a digital interface between the DFE circuitry and the BB circuitry,
wherein the DFE circuitry comprises a data compression circuitry configured to compress the plurality of data symbols for use in transmission via the digital interface to the BB circuitry,
wherein the data compression circuitry is configured to compress the plurality of data symbols based on a removal of an unused subcarrier and the removal of a cyclic prefix, the data compression circuitry utilizing an OFDM-symbol-aligned Fast Fourier Transform (FFT) window for data compression to substantially eliminate out-of-band spectral content for data transmission.

2. The data processing device of claim 1,
wherein the data compression circuitry comprises a Fast Fourier Transform (FFT) circuitry configured to perform a compression of the plurality of data symbols.

3. The data processing device of claim 1,
wherein the plurality of data symbols comprises a plurality of Orthogonal Frequency Division Multiplex (OFDM) symbols.

4. The data processing device of claim 1,
wherein the digital interface is configured to transmit frequency domain samples of the plurality of data symbols between the DFE circuitry and the BB circuitry.

5. The data processing device of claim 2,
wherein the data compression circuitry is configured to compress the plurality of data symbols based on using different word lengths for inband FFT samples and out-of-band FFT samples.

6. The data processing device of claim 1,
wherein the data compression circuitry is configured to compress the plurality of data symbols based on lossless compression when the data compression circuitry is operated in a lossless compressor mode.

7. The data processing device of claim 6,
wherein the data compression circuitry is configured to compress the plurality of data symbols into OFDM symbol-aligned frequency domain samples when the data compression circuitry is operated in the lossless compressor mode.

8. The data processing device of claim 7,
wherein a symbol boundary position of the OFDM symbol-aligned frequency domain samples is known when the data compression circuitry is operated in the lossless compressor mode.

9. The data processing device of claim 1,
wherein the data compression circuitry is configured to compress the plurality of data symbols based on lossy compression when the data compression circuitry is operated in a lossy compressor mode.

10. The data processing device of claim 9,
wherein the data compression circuitry is configured to compress the plurality of data symbols into non-OFDM symbol-aligned frequency domain samples when the data compression circuitry is operated in the lossy compressor mode.

11. The data processing device of claim 1, comprising:
control loop processing circuitry arranged between the BB circuitry and the DFE circuitry, wherein the control loop processing circuitry is configured to time-align the compressed data symbols with non-compressed data symbols.

12. The data processing device of claim 11,
wherein the control loop processing circuitry is configured to time-align the compressed data symbols in lossless compressor mode with the compressed data symbols in lossy compressor mode.

13. The data processing device of claim 1, wherein the data compression circuitry is configured to (i) compress the plurality of data symbols into OFDM symbol-aligned frequency domain samples when the data compression circuitry is operated in a lossless compressor mode in accordance with the removal of the unused subcarrier, and (ii) to compress the plurality of data symbols into non-OFDM symbol-aligned frequency domain samples when the data compression circuitry is operated in a lossy compressor mode.

14. The data processing device of claim 2, wherein the FFT circuitry is configured to compress the plurality of data symbols into non-OFDM symbol-aligned frequency domain samples using frequency-dependent conversion from fixed point into floating point with different word lengths.

15. The data processing device of claim 14, wherein the BB circuitry includes decompressor circuitry configured to map, in a frequency-dependent manner, data compressed via the data compression circuitry from a floating point format to an input format utilized by inverse Fast Fourier Transform (IFFT) circuitry.

* * * * *